(12) United States Patent
Dosho et al.

(10) Patent No.: US 7,773,023 B2
(45) Date of Patent: Aug. 10, 2010

(54) A-TO-D CONVERTER

(75) Inventors: Shiro Dosho, Osaka (JP); Takashi Morie, Osaka (JP); Kazuo Matsukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 12/162,930

(22) PCT Filed: Nov. 30, 2007

(86) PCT No.: PCT/JP2007/073226

§ 371 (c)(1),
(2), (4) Date: Jul. 31, 2008

(87) PCT Pub. No.: WO2008/069144

PCT Pub. Date: Jun. 12, 2008

(65) Prior Publication Data

US 2009/0040089 A1    Feb. 12, 2009

(30) Foreign Application Priority Data

Dec. 4, 2006   (JP) .............................. 2006-327081

(51) Int. Cl.
*H03M 1/40* (2006.01)
(52) U.S. Cl. .................. 341/163; 341/150; 341/172
(58) Field of Classification Search ................. 341/145, 341/146, 150, 163, 172; 377/54, 55, 56, 377/70, 75, 76
See application file for complete search history.

(56) References Cited

U.S. PATENT DOCUMENTS

| | | | | |
|---|---|---|---|---|
| 3,906,488 A | * | 9/1975 | Suarez-Gartner | 341/172 |
| 5,835,551 A | * | 11/1998 | Kawarazaki | 377/20 |
| 6,040,725 A | * | 3/2000 | Lee et al. | 377/54 |
| 6,288,668 B1 | * | 9/2001 | Tsukamoto et al. | 341/172 |
| 2006/0055577 A1 | * | 3/2006 | Boemler | 341/155 |
| 2007/0001893 A1 | | 1/2007 | Shinohara | |

OTHER PUBLICATIONS

Sagara, I., "A/D-D/A Henkan Kairo Nyumon", Introduction to A-to-D and D-to-A Converter Circuits 2nd ed., Mar. 2003, pp. 114-115, The Nikkan Kogyo Shimbun, Ltd.

Suarez, R., et al., "An all-MOS charge-redistribution A/D conversion technique", 1974 IEEE International Solid-State Circuits Conference Digest of Technical Papers Session XVI: A/D and D/A Techniques FAM16.4, Sep. 15, 1974, pp. 194-195,248, vol. XVII.

* cited by examiner

*Primary Examiner*—Howard Williams
(74) *Attorney, Agent, or Firm*—McDermott Will & Emery LLP

(57) ABSTRACT

A successive approximation type A-to-D converter includes a cyclic D-to-A converter (11), a comparator (12) for comparing an analog value with an output value of the D-to-A converter (11), and memory means (13) for sequentially storing an output value of the comparator (12) and supplying the stored value to the D-to-A converter (11) in a reverse order.

8 Claims, 21 Drawing Sheets

US 7,773,023 B2

A-TO-D CONVERTER

RELATED APPLICATIONS

This application is the U.S. National Phase under 35 U.S.C. §371 of International Application No. PCT/JP2007/073226, filed on Nov. 30, 2007, which in turn claims the benefit of Japanese Application No. 2006-327081, filed on Dec. 4, 2006, the disclosures of which Applications are incorporated by reference herein.

TECHNICAL FIELD

The invention relates to an A-to-D (analog-to-digital) converter, and more particularly, to a successive approximation type A-to-D converter, and an A-to-D converter having parallel-connected successive approximation type A-to-D converters.

BACKGROUND ART

There are various kinds of A-to-D converters (ADCs). Among others, successive approximation type ADCs have a good balance of accuracy, speed, cost, and the like and have been used in various applications. A successive approximation type ADC generally includes a capacitor array or resistor string D-to-A (digital-to-analog) converter (DAC), a successive approximation register (SAR), and a comparator, and converts an analog signal to a digital signal by binary search. The SAR successively determines a digital value from a most significant bit (MSB) based on an output value of the comparator. More specifically, the SAR sets a first lower bit from the successively determined bits to "1" and the DAC outputs an analog value corresponding to this digital value. When an input analog signal is larger than this analog value, the first lower bit is retained at "1." Otherwise, the lower bit is set to "0." The input analog signal is thus converted to an n-bit digital signal by n comparison operations (see, for example, Non-patent document 1). Non-patent document 1: Sagara, Iwao. *A/D•D/A Henkan Kairo Nyumon (Introduction to A-to-D and D-to-A Converter Circuits).* 2nd ed. The Nikkan Kogyo Shimbun, Ltd., March 2003. pp. 114-115.

DISCLOSURE OF THE INVENTION

Problems to be Solved by the Invention

An ADC is an essential electronic circuit for various applications. With recent improvement in radio communication technology, further reduction in power consumption has been especially demanded. Since battery life is crucial especially for portable equipments, there has been a very strict demand for reduced power consumption of electronic circuits for use in portable equipments. Moreover, for portable equipments, a plurality of radio communication systems having different system specifications need to be implemented on a single integrated circuit. Since the area unit price of integrated circuits has been increased with process miniaturization, integrating a plurality of radio systems on an integrated circuit increases the unit cost of integrated circuits, which is a serious disadvantage in terms of the cost.

In order to solve this problem, it is necessary to implement a software radio system capable of integrating a plurality of radio system specifications therein so that a radio signal, even when a reception frequency of the radio signal is modified, can be converted to a high accuracy digital signal while maintaining the frequency as high as possible. Although a software radio system requires a high-speed, high accuracy ADC with low power consumption, there has not been such a high performance ADC.

A successive approximation type ADC is capable of performing high accuracy A-to-D conversion. However, a DAC has a low operation speed, and a relatively large circuit size is required to maintain the accuracy of the DAC. For example, a 10-bit capacitor array DAC requires 1,024 ($=2^{10}$) capacitors. However, such a large number of capacitors impose a heavy burden on the DAC, reducing a D-to-A conversion speed and increasing power consumption. As a result, the ADC has a reduced operation speed and increased power consumption.

In view of the above problems, it is an object of the invention to provide a successive approximation type A-to-D converter with a reduced circuit size and reduced power consumption. It is another object of the invention to provide a high speed A-to-D converter using such a successive approximation type A-to-D converter.

Means for Solving the Problems

In order to achieve the above objects, according to one aspect of the invention, a successive approximation type A-to-D converter includes: a cyclic D-to-A converter; a comparator for comparing an analog value with an output value of the D-to-A converter; and memory means for sequentially storing an output value of the comparator and supplying the stored value to the D-to-A converter in a reverse order. Since the circuit size and power consumption of the cyclic DAC are very small, the circuit size and power consumption of the successive approximation type A-to-D converter can be significantly reduced.

More specifically, the D-to-A converter may include first and second capacitors having a same capacitance value and having their respective one ends connected to a voltage node corresponding to an L-level logic value, a first switch connected between an input end and another end of the first capacitor, a second switch connected between the another end of the first capacitor and another end of the second capacitor and switching to an opposite switching state to the first switch, and a third switch connected between the another end of the second capacitor and the voltage node.

More specifically, the memory means may be structured such that a plurality of flip-flops are connected in a ring shape through selectors for selectively outputting one of one or more inputs, an output value of a first flip-flop is supplied to each selector as one of inputs, an H-level logic value is supplied to a selector located on an input side of the first flip-flop as one of inputs, and an output value of the comparator is supplied to a selector located on an input side of a second flip-flop as one of inputs. An output value of the first flip-flop may be supplied to the D-to-A converter.

More specifically, the memory means may include a plurality of flip-flops, an input control section for sequentially storing an output value of the comparator to the plurality of flip-flops, and an output control section for receiving respective output values of the plurality of flip-flops and an H-level logic value and sequentially supplying the received output values and the received H-level logic value to the D-to-A converter.

Preferably, the above successive approximation type A-to-D converter further includes: a capacitor array D-to-A converter; a successive approximation register for successively storing an output value of the comparator and successively supplying the stored value to the capacitor array D-to-A converter; and a selector for receiving an output value of the comparator and selectively supplying the received output value to the storage means or the successive approximation register. The comparator compares the analog value with a total output value of the cyclic D-to-A converter and the capacitor array D-to-A converter. With this structure, the A-to-D conversion speed can be increased by the successive approximation register and the capacitor array D-to-A converter while reducing the circuit size and power consumption by the memory means and the cyclic D-to-A converter.

According to another aspect of the invention, an A-to-D converter includes: a plurality of successive approximation type A-to-D converters according to the above one aspect of the invention; a plurality of sample and hold circuits for supplying an analog value to each of the plurality of successive approximation type A-to-D converters; and a multiplexer for sequentially supplying an input analog signal to the plurality of sample and hold circuits. Flip-flops included in the respective memory means of the plurality of successive approximation type A-to-D converters for storing an output value of the respective comparator are connected together to form a shift register. In this structure, the successive approximation type A-to-D converters are connected in parallel, whereby the A-to-D conversion speed can be improved.

According to still another aspect of the invention, an A-to-D converter includes: a plurality of A-to-D converters according to the above another aspect of the invention; an input selecting section for selecting one of the plurality of A-to-D converters which is not performing A-to-D conversion and supplying an input analog signal to the selected A-to-D converter; and an output selecting section for selecting one of the plurality of A-to-D converters which is not performing A-to-D conversion and outputting a digital signal that is output from the selected sub A-to-D converter. In this structure, the plurality of parallel-connected successive approximation type A-to-D converters perform interleave operation, whereby high speed A-to-D conversion can be continuously performed.

Effects of the Invention

As has been described above, according to the invention, the circuit size and power consumption of a successive approximation type A-to-D converter can be significantly reduced. Moreover, faster A-to-D conversion can be implemented by connecting such successive approximation type A-to-D converters in parallel.

DESCRIPTION OF THE REFERENCE NUMERALS

Figure 1:
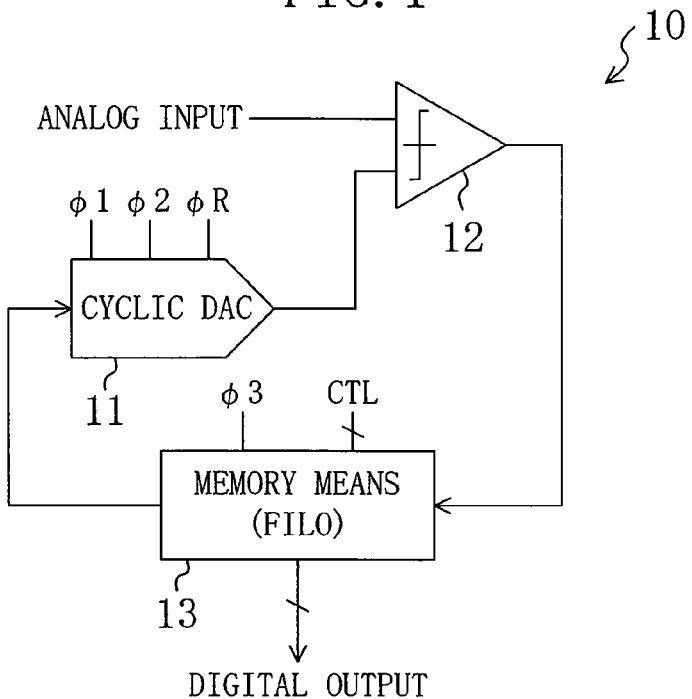
FIG. 1 shows a structure of a successive approximation type ADC according to a first embodiment.

10 A-to-D converter
11 D-to-A converter
12 comparator
13 memory means
111 capacitor (first capacitor)
112 capacitor (second capacitor)
113 switch (first switch)
114 switch (second switch)
115 switch (third switch)
$131_i$ flip-flop
$132_i$ selector
133 input control section
134 output control section
14 D-to-A converter
15 successive approximation register
16 selector
20 A-to-D converter
21 multiplexer
22 sample and hold circuit
23 control circuit
24 trigger circuit
30 A-to-D converter
31 input selecting section
32 output selecting section

BEST MODE FOR CARRYING OUT THE INVENTION

Hereinafter, best modes for carrying out the invention will be described with reference to the accompanying drawings.

First Embodiment

FIG. 1 shows a structure of a successive approximation type ADC according to a first embodiment. An ADC 10 includes a cyclic DAC 11, a comparator 12, and memory means 13. The comparator 12 compares an input analog value of the ADC 10 with an output value of the DAC 11 and outputs a 1-bit logic value.

Figure 2:
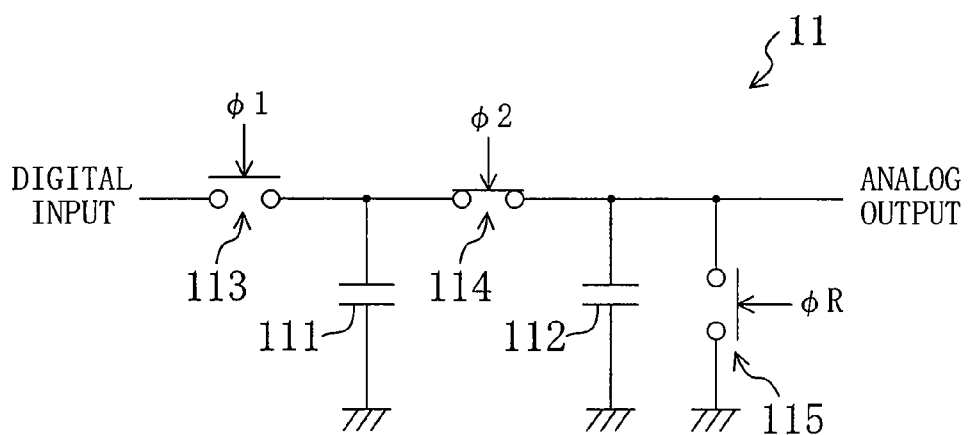
FIG. 2 shows a structure of a cyclic DAC.

The DAC 11 receives a digital value on a bit-by-bit basis sequentially from a least significant bit (LSB) and converts the received digital value to an analog value. FIG. 2 shows a structure of the DAC 11. Capacitors 111 and 112 have the same capacitance value and have their respective one ends connected to a ground node. A switch 113 is inserted between the other end of the capacitor 111 and a digital input end. A switch 114 is inserted between the other end of the capacitor 111 and the other end of the capacitor 112. A switch 115 is inserted between the other end of the capacitor 112 and the ground node. A charged voltage of the capacitor 112 is output as an analog output.

The DAC 11 operates as follows: First, with the switch 113 turned off and the switch 114 turned on, the switch 115 is turned on by a reset signal $\phi R$ and the capacitors 111 and 112 are reset (discharged). The switch 115 is then turned off and the switches 113 and 114 are complementarily switched by clock signals $\phi 1$ and $\phi 2$, respectively. More specifically, when the switch 113 is on, a power supply voltage corresponding to an H logic level or a ground voltage corresponding to an L logic level is applied to the capacitor 111. On the other hand, when the switch 114 is on, charges are redistributed between the capacitors 111 and 112.

It is herein assumed that a power supply voltage (VDD) is applied to the capacitor 111 when an input digital value is "1," and a ground voltage (0) is applied to the capacitor 111 when the input digital value is "0." Provided that Q(n) indicates charges that have been charged in the capacitor 112 in the $n^{th}$ clock cycle and C indicates the capacitance value of each capacitor 111, 112, charges Q(n+1) to be charged in the capacitor 112 in the $(n+1)^{th}$ clock cycle are shown by the following formula:

$$Q(n+1) = \frac{C \times (VDD \text{ or } 0) + Q(n)}{2} \quad \text{[Formula 1]}$$

This formula shows that the total charges in the capacitors 111 and 112 are reduced by half every time the switch 114 is switched. Provided that $b_n$ indicates an input digital value in the $n^{th}$ clock cycle, charges Q(n) and a voltage V(n) that have been charged in the capacitor 112 at the end of the $n^{th}$ clock cycle are respectively shown by the following formulas:

$$Q(n) = VDD \sum_{k=1}^{n} \frac{Cb_k}{2^{n+1-k}} \quad \text{[Formula 2]}$$

$$V(n) = VDD \sum_{k=1}^{n} \frac{b_k}{2^{n+1-k}}$$

Figure 3:
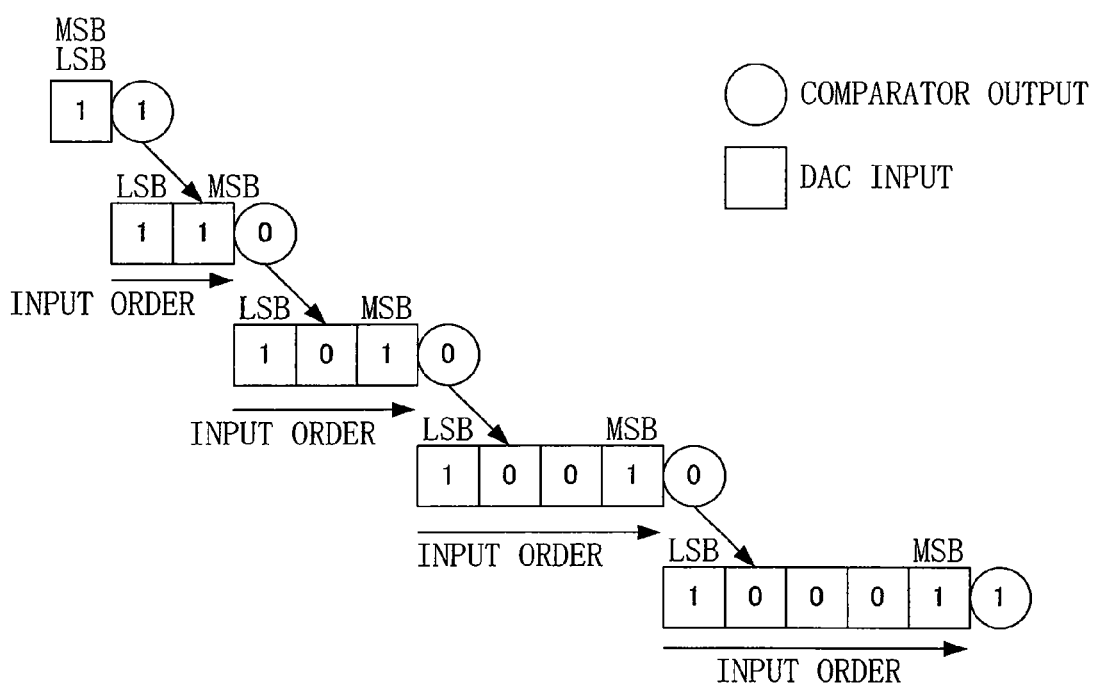
FIG. 3 shows a relation between a comparator output and a DAC input.

Although a digital value needs to be applied to the DAC 11 sequentially from the LSB, the digital value is output from the comparator 12 sequentially from a most significant bit (MSB). Therefore, bit values that are output from the comparator 12 need to be applied to the DAC 11 in a first-in last-out (FILO) manner. FIG. 3 shows a relation between a comparator output and a DAC input. In a successive approximation type ADC for performing A-to-D conversion by binary search, a LSB of a digital value that is applied to the DAC is always "1." Therefore, "1" is first applied to the DAC 11. Thereafter, every time a bit value is output from the comparator 12, an output value of the comparator 12 is applied to the DAC 11 in a reverse order to the order in which the output value is output from the comparator 12.

The memory means 13 applies bit values that are output from the comparator 12 as described above to the DAC 11 in a first-in last-out manner. Hereinafter, two structural examples of the memory means 13 will be described. For convenience, it is herein assumed that the ADC 10 has a 4-bit resolution.

Figure 4:
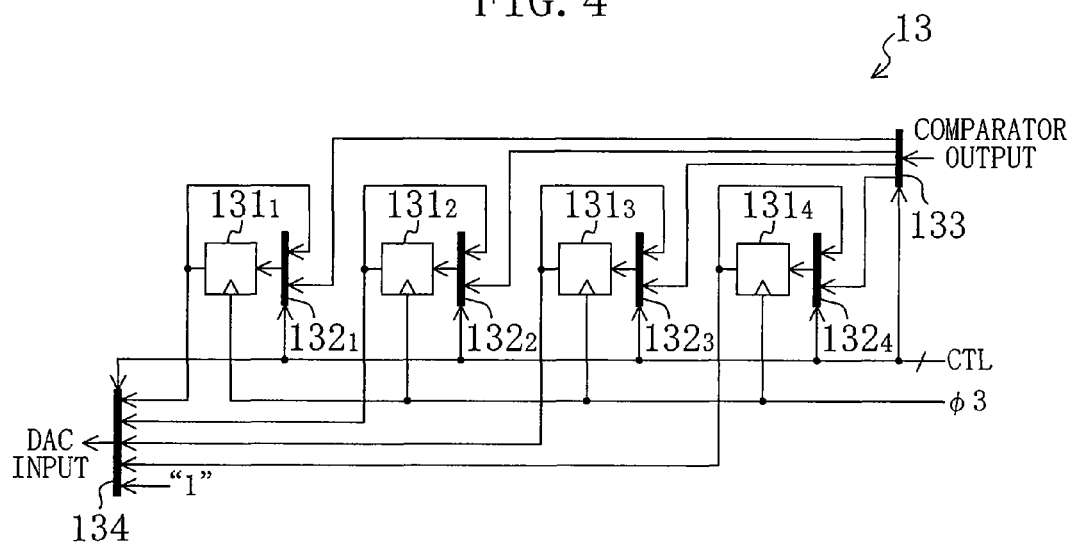
FIG. 4 shows a first structural example of memory means.

FIG. 4 shows a first structural example of the memory means 13. Four flip-flops $131_1$, $131_2$, $131_3$, and $131_4$ latch bit values supplied from selectors $132_1$, $132_2$, $132_3$, and $132_4$ in synchronization with a clock signal $\phi 3$, respectively. An input control section 133 receives an output value of the comparator 12 and sequentially supplies the output value to the selectors $132_1$ through $132_4$. In the case where corresponding bit values are supplied from the input control section 133 to the selectors $132_1$ through $132_4$, the selectors $132_1$ through $132_4$ output the corresponding bit values, respectively. Otherwise, the selectors $132_1$ through $132_4$ feed back output values of the flip-flops $131_1$ through $131_4$, respectively. The output control section 134 receives respective output values of the flip-flops $131_1$ through $131_4$ and a bit value "1" and sequentially output the bit value "1" and the respective output values of the flip-flops $131_4$ through $131_1$ in this order. The selectors $132_1$ through $132_4$, the input control section 133, and the output control section 134 are controlled by a control signal CTL.

Figure 5:
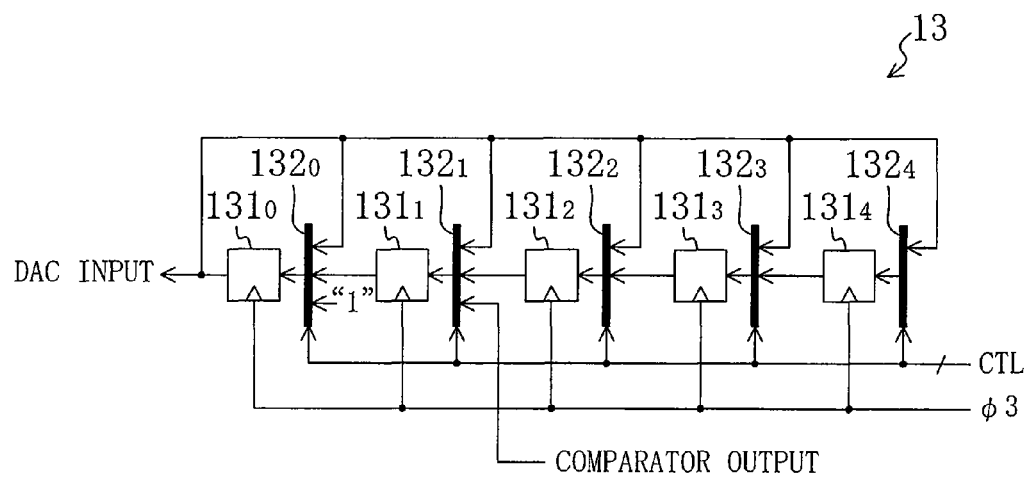
FIG. 5 shows a second structural example of the memory means.

FIG. 5 shows a second structural example of the memory means 13. Five flip-flops $131_0$ through $131_4$ are connected in a ring shape through selectors $132_0$ through $132_4$. The flip-flops $131_0$ through $131_4$ latch bit values supplied from the selectors $132_0$ through $132_4$ in synchronization with a clock signal $\phi 3$, respectively. An output value of the flip-flop $131_0$ is applied to the DAC 11. The output value of the flip-flop $131_0$ is also applied to the selectors $132_0$ through $132_4$. In other words, all of the flip-flops $131_0$ through $131_4$ are able to latch the output value of the flip-flop $131_0$. A bit value "1" is applied to the selector $132_0$ and an output value of the comparator 12 is applied to the selector $132_1$. The selectors $132_0$ through $132_4$ are controlled by a control signal CTL. Since the selector $132_4$ has one input, the selector $132_4$ may be omitted.

Figure 6:
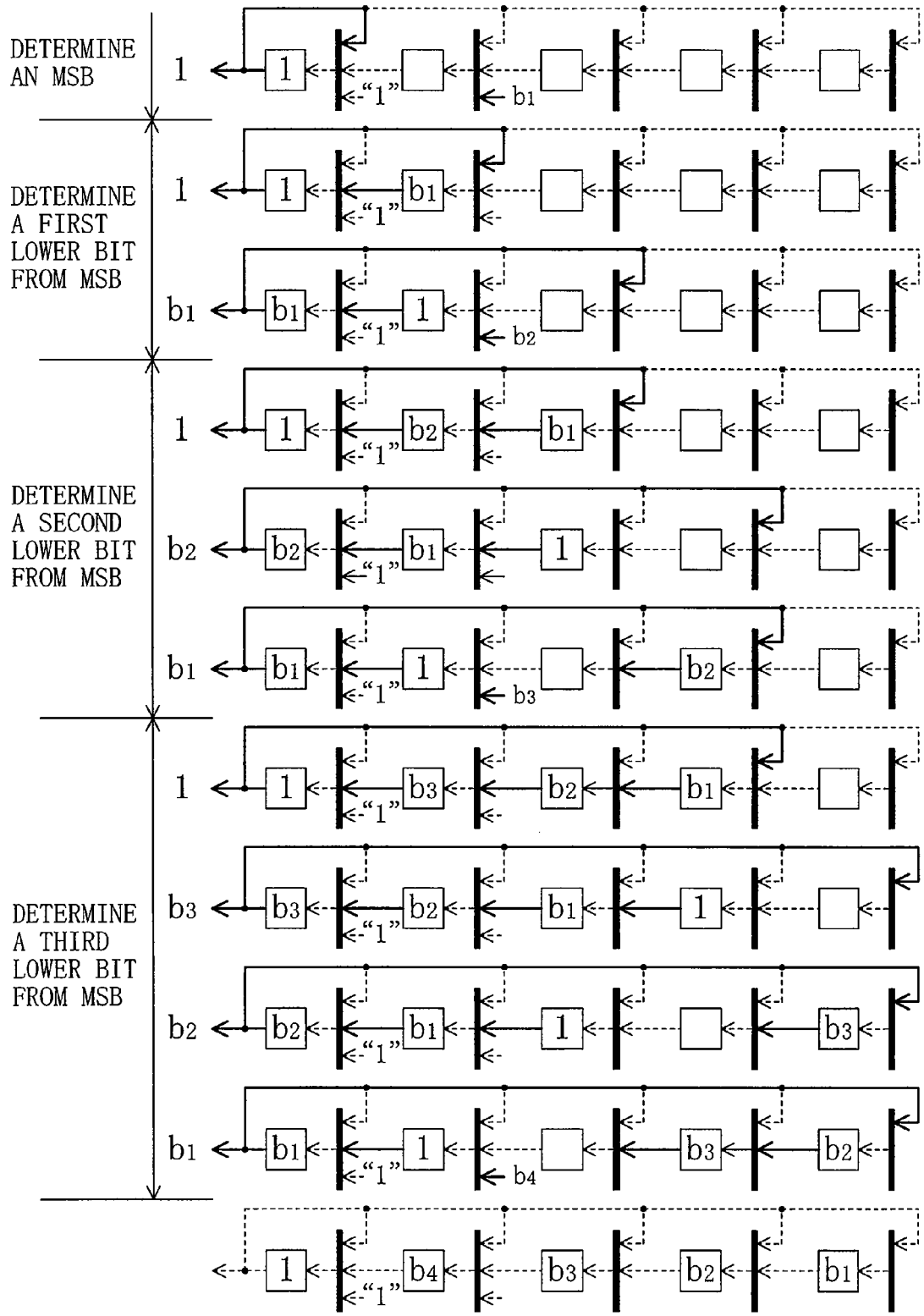
FIG. 6 illustrates operation of the memory means shown in FIG. 5.

FIG. 6 illustrates operation of the memory means 13 shown in FIG. 5. Note that, in FIG. 6, the reference numerals are omitted and an input selected by each selector is shown by solid lines. The flip-flop $131_0$ initially latches a bit value "1" selected by the selector $132_0$ and then A-to-D conversion in the ADC 10 is started (not shown).

In a first phase of determining an MSB of an output digital value, the flip-flop $131_0$ outputs the bit value "1." The flip-flop $131_0$ then latches its own output value "1" selected by the selector $132_0$, and the flip-flop $131_1$ latches an output value $b_1$ of the comparator 12 selected by the selector $132_1$.

In a second phase of determining a first lower bit from MSB of the output digital value, the flip-flop $131_0$ first outputs a bit value "1." The flip-flop $131_0$ then latches an output value $b_1$ of the flip-flop $131_1$ selected by the selector $132_0$, and the flip-flop $131_1$ latches the output value "1" of the flip-flop $131_0$ selected by the selector $132_1$. The flip-flop $131_0$ then outputs a bit value $b_1$. The flip-flop $131_1$ latches an output value "1" of the flip-flop $131_1$ selected by the selector $132_0$, the flip-flop $131_1$ latches an output value $b_2$ of the comparator 12 selected by the selector $132_1$, and the flip-flop $131_2$ latches the output value $b_1$ of the flip-flop $131_0$ selected by the selector $132_2$.

In a third phase of determining a second lower bit from MSB of the output digital value, the flip-flop $131_0$ first outputs a bit value "1." The flip-flop $131_0$ then latches an output value $b_2$ of the flip-flop $131_1$ selected by the selector $132_0$, the flip-flop $131_1$ latches an output value $b_1$ of the flip-flop $131_2$ selected by the selector $132_1$, and the flip-flop $131_2$ latches the output value "1" of the flip-flop $131_0$ selected by the selector $132_2$. The flip-flop $131_0$ then outputs a bit value $b_2$. The flip-flop $131_0$ latches an output value $b_1$ of the flip-flop $131_1$ selected by the selector $132_0$, the flip-flop $131_1$ latches an output value "1" of the flip-flop $131_2$ selected by the selector $132_1$, and the flip-flop $131_3$ latches the output value $b_2$ of the flip-flop $131_0$ selected by the selector $132_3$. The flip-flop $131_0$ then outputs a bit value $b_1$. The flip-flop $131_1$ latches an output value "1" of the flip-flop $131_1$ selected by the selector $132_0$, the flip-flop $131_1$ latches an output value $b_3$ of the comparator 12 selected by the selector $132_1$, the flip-flop $131_2$ latches an output value $b_2$ of the flip-flop $131_3$ selected by the selector $132_2$, and the flip-flop $131_3$ latches the output value $b_1$ of the flip-flop $131_0$ selected by the selector $132_3$.

In a fourth phase of determining a third lower bit from MSB of the output digital value, the flip-flop $131_0$ first outputs a bit value "1." The flip-flop $131_0$ then latches an output value $b_3$ of the flip-flop $131_1$ selected by the selector $132_0$, the flip-flop $131_1$ latches an output value $b_2$ of the flip-flop $131_2$ selected by the selector $132_1$, the flip-flop $131_2$ latches an output value $b_1$ of the flip-flop $131_3$ selected by the selector $132_2$, and the flip-flop $131_3$ latches the output value "1" of the flip-flop $131_0$ selected by the selector $132_3$. The flip-flop $131_0$ then outputs a bit value $b_3$. The flip-flop $131_0$ latches an output value $b_2$ of the flip-flop $131_1$ selected by the selector $132_0$, the flip-flop $131_1$ latches an output value $b_1$ of the flip-flop $131_2$ selected by the selector $132_1$, the flip-flop $131_2$ latches an output value "1" of the flip-flop $131_3$ selected by the selector $132_2$, and the flip-flop $131_4$ latches the output value $b_3$ of the flip-flop $131_0$ selected by the selector $132_4$. The flip-flop $131_0$ then outputs a bit value $b_2$. The flip-flop $131_0$ latches an output value $b_1$ of the flip-flop $131_1$ selected by the selector $132_0$, the flip-flop $131_1$ latches an output value "1" of the flip-flop $131_2$ selected by the selector $132_1$, the flip-flop $131_3$ latches an output value $b_3$ of the flip-flop $131_4$ selected by the selector $132_3$, and the flip-flop $131_4$ latches the output value $b_2$ of the flip-flop $131_0$ selected by the selector $132_4$. The flip-flop $131_0$ then outputs a bit value $b_1$. The flip-flop 131 latches an output value "1" of the flip-flop $131_1$ selected by the selector $132_0$, the flip-flop $131_1$ latches an output value $b_4$ of the comparator 12 selected by the selector $132_1$, the flip-flop $131_2$ latches an output value $b_3$ of the flip-flop $131_3$ selected by the selector $132_2$, the flip-flop $131_3$ latches an output value $b_2$ of the flip-flop $131_4$ selected by the selector $132_3$, and the flip-flop $131_4$ latches the output value $b_1$ of the flip-flop $131_0$ selected by the selector $132_4$. A 4-bit digital value obtained by A-to-D conversion has thus been stored in the flip-flops $131_1$ through $131_4$ at the end of the fourth phase.

Figure 7:
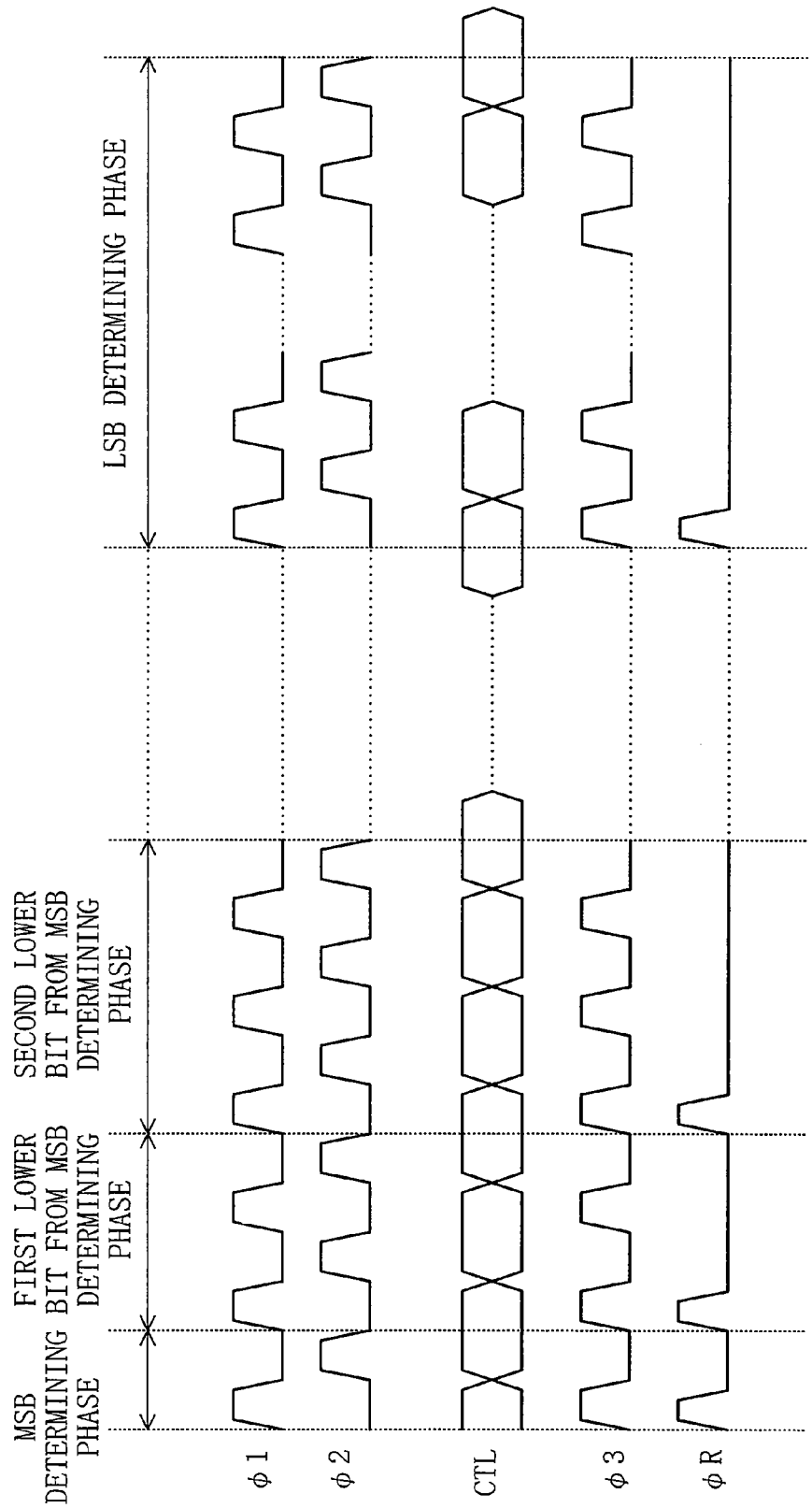
FIG. 7 is a timing chart of various signals for controlling the successive approximation type ADC of FIG. 1.
Figure 8:
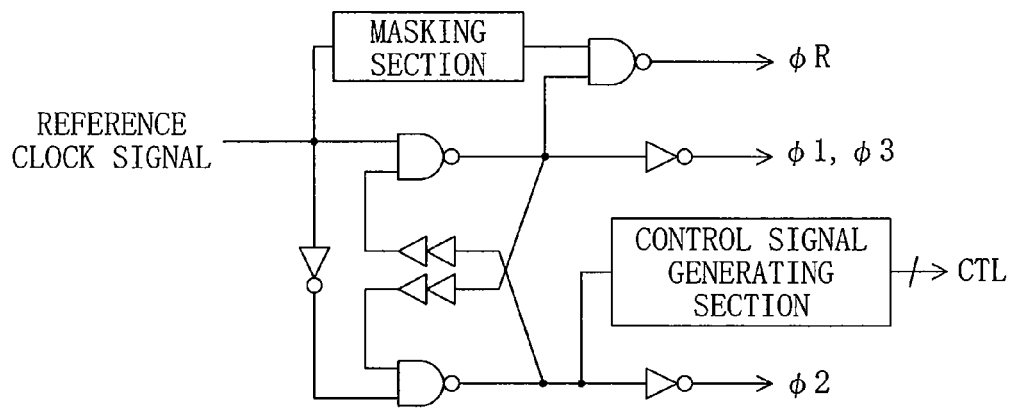
FIG. 8 shows a structure of a circuit for generating various signals for controlling the successive approximation type ADC of FIG. 1.

FIG. 7 is a timing chart of various signals for controlling the ADC 10. FIG. 8 shows a structural example of a circuit for generating these signals. Clock signals $\phi1$ and $\phi2$ for driving the DAC 11 have to be exclusive two-phase clock signals having no overlap period with each other. These clock signals $\phi1$ and $\phi2$ can be easily generated from a reference clock signal by using a NAND gate and a delay buffer. A reset signal $\phi R$ for the DAC 11 is output at the beginning of each phase of determining a respective bit of an output digital value. The reset signal $\phi R$ can be easily generated by appropriately masking the clock signal $\phi1$. An operation clock signal $\phi3$ for each flip-flop in the memory means 13 may have the same timing as the clock signal $\phi1$. Therefore, a common clock signal can be used as the clock signals $\phi1$ and $\phi3$. A control signal CTL for each selector in the memory means 13 is caused to transition in synchronization with the clock signal $\phi2$. This assures a sufficient setup and hold period in each flip-flop.

Since the DAC may include only two capacitors in this embodiment, the circuit size of the ADC can be significantly reduced. Moreover, since a burden on the DAC is reduced, power consumption can be reduced.

In the case where the memory means 13 cannot receive an accurate value due to slow output transition of the comparator 12, a latch circuit may be provided on the output side of the comparator 12. This latch circuit may operate at the end of each phase of determining a respective bit value. A signal for driving this latch circuit can be generated by appropriately masking the clock signal $\phi2$. In the case where a sufficient voltage cannot be applied to the capacitor 111 in the DAC 11 due to poor driving capability of the flip-flops for supplying a digital value to the DAC 11, a digital value may be supplied to the capacitor 111 through a selector for selectively supplying a power supply voltage or a ground voltage according to an output value of the flip-flops.

Second Embodiment

Figure 9:
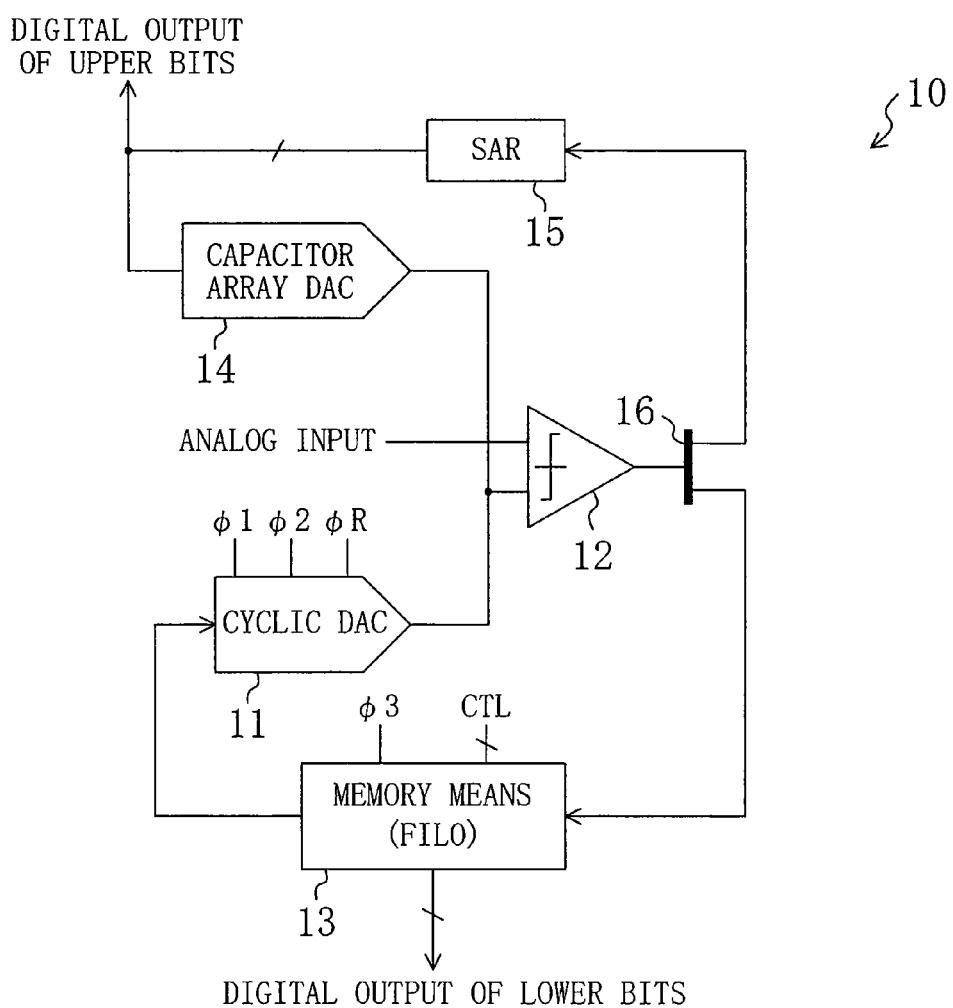
FIG. 9 shows a structure of a successive approximation type ADC according to a second embodiment.

FIG. 9 shows a structure of a successive approximation type ADC according to a second embodiment. An ADC 10 of this embodiment has a combined structure of a conventional successive approximation type ADC, which has a capacitor array DAC 14 and a successive approximation register (SAR) 15, and the ADC of the first embodiment. Respective outputs of the memory means 13 and the SAR 15 are both applied to the comparator 12. A selector 16 supplies an output value of the comparator 12 to the SAR 15 during the first half of A-to-D conversion and supplies the output value of the comparator 12 to the memory means 13 during the latter half thereof. In other words, A-to-D conversion of upper bits is performed by the capacitor array DAC 14 and a digital value of the upper bits is output from the SAR 15. A-to-D conversion of lower bits is performed by the cyclic DAC 11 and a digital value of the lower bits is output from the memory means 13.

A conventional successive approximation type ADC can obtain an n-bit resolution in n clock cycles. On the other hand, the ADC of the first embodiment requires the number of cock cycles corresponding to the summation of 1 to n, that is, n(n+1)/2 clock cycles, to obtain an n-bit resolution. This is because, in each phase of determining a respective bit of an output digital value, the ADC of the first embodiment needs to supply bit values that have been output from the comparator 12 to the DAC 11 in a reverse order. Therefore, the ADC of the first embodiment is disadvantageous in terms of the conversion speed. By combining the conventional successive approximation type ADC with the successive approximation type ADC of the first embodiment as in the second embodiment, the conversion speed can be increased while reducing the circuit size and power consumption.

Figure 10:
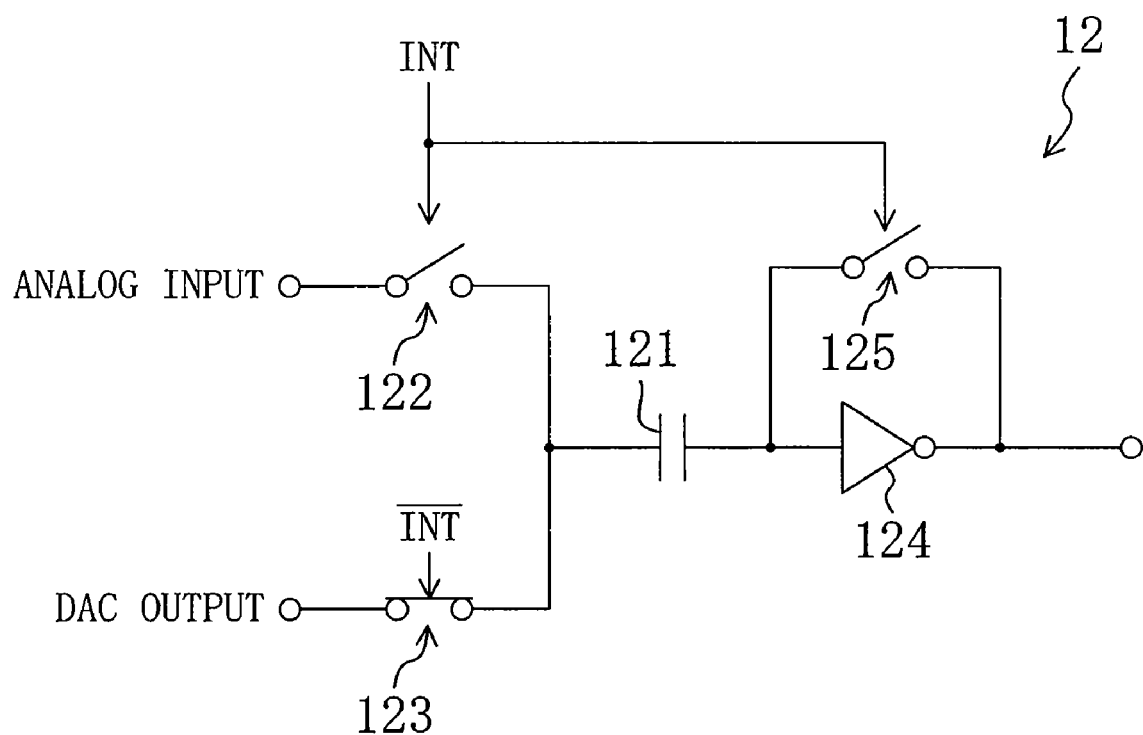
FIG. 10 shows a structure of a chopper type comparator.

In the case where a normal differential amplification type comparator is used as the comparator 12 in the first and second embodiments, a wrong value may be output due to an offset voltage or the like. Therefore, a chopper type comparator that is less susceptible to an offset voltage may be used as the comparator 12. FIG. 10 shows a structural example of the chopper type comparator 12. In the comparator 12, an input analog signal of the ADC 10 or an output of a DAC 11 is applied to a capacitor 121 through a switch 122 or a switch 123. The switches 122 and 123 are switched by a signal INT and an inverted signal /INT thereof, respectively, and have opposite switching states. An inverter 124 inverts a logic value corresponding to a voltage generated in the capacitor 121 and outputs the resultant 1-bit logic value. Input/output ends of the inverter 124 can be short-circuited by a switch 125. The switch 125 is switched by the same signal INT and has the same switching state as the switch 122. At the beginning of operation of the comparator 12, the switches 122 and 125 are closed and the switch 123 is opened. As a result, the input/output ends of the inverter 124 are short-circuited and input/output voltages are stabilized at an equilibrium point (auto-zero operation) and the capacitor 121 is charged by an input analog signal of the ADC 10. Thereafter, the switches 122 and 125 are opened and the switch 123 is closed, whereby the DAC 11 is connected to the comparator 12. In the case where an output voltage of the DAC 11 is higher than a voltage of the capacitor 121, an input voltage of the inverter 124 is higher than the equilibrium point. Therefore, the inverter 124 outputs "0." On the other hand, in the case where an output voltage of the DAC 11 is lower than a voltage of the capacitor 121, an input voltage of the inverter 124 is lower than the equilibrium point. Therefore, the inverter 124 outputs "1." As described above, even when a chopper type comparator is used as the comparator 12, the ADC 10 of this embodiment can be formed by a smaller number of capacitors than that used in the conventional successive approximation type ADC. Therefore, the circuit size can be significantly reduced. Moreover, since the number of capacitors is reduced, a driving current of the ADC is reduced, enabling reduction in power consumption.

Third Embodiment

Figure 11:
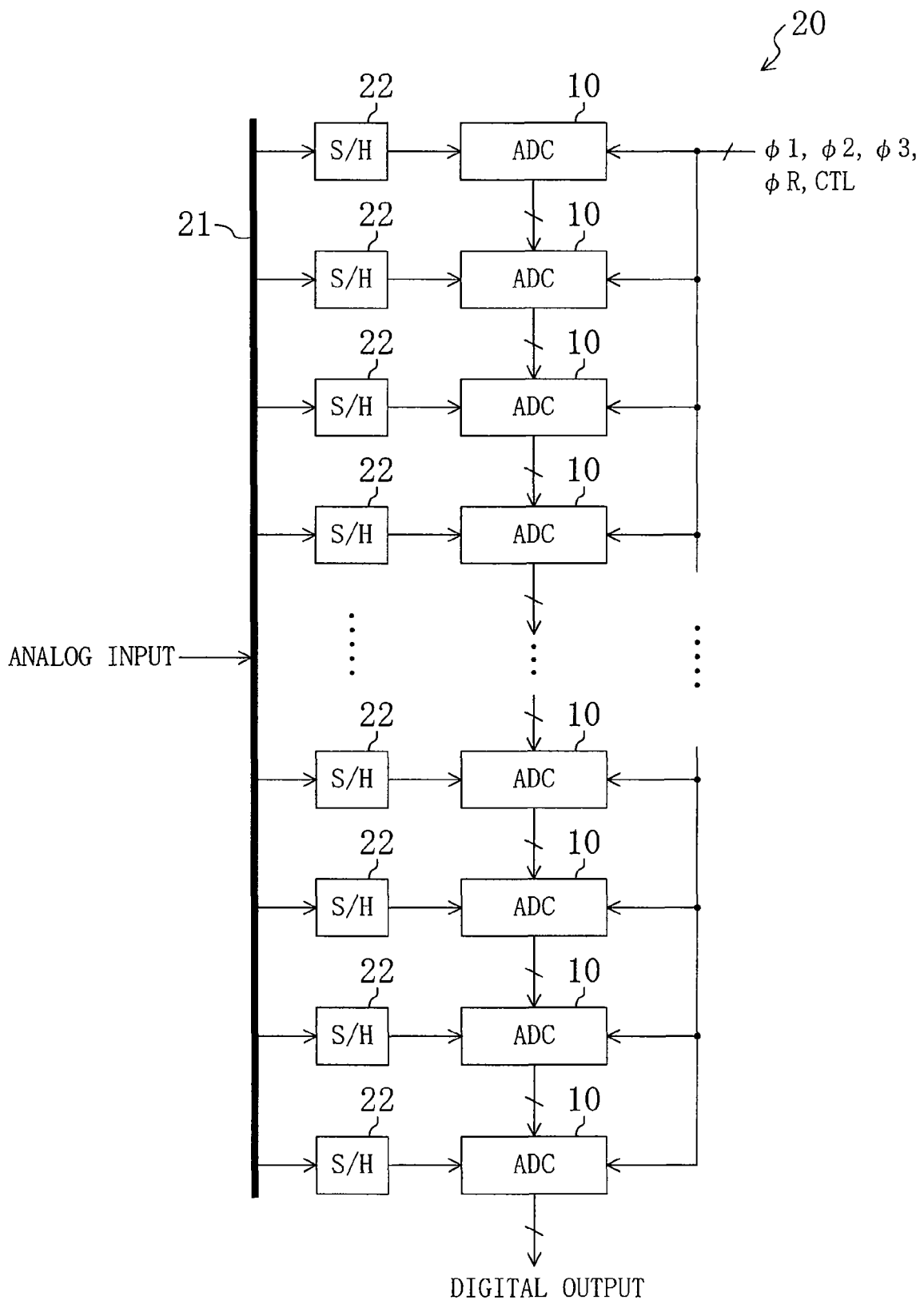
FIG. 11 shows a structure of an ADC according to a third embodiment.

FIG. 11 shows a structure of an ADC according to a third embodiment. An ADC 20 includes a multiplexer 21, a plurality of sample and hold circuits 22, and a plurality of ADCs 10 (sub-ADCs). Each ADC 10 is a successive approximation type ADC of the first or second embodiment. Each ADC 10 receives an analog value from a corresponding sample and hold circuit 22 and converts the analog value to a digital value. The multiplexer 21 sequentially supplies an input analog signal to each of the plurality of sample and hold circuits 22. Each sample and hold circuit 22 samples and holds the supplied analog signal. The ADC 20 thus includes the parallel-connected ADCs 10. Note that, in the chopper type comparator 12 of FIG. 10, the capacitor 121 operates as a sample and hold circuit 22.

The number of parallel-connected ADCs 10 is determined based on clock latency required for A-to-D conversion of each ADC 10. For example, in order to obtain a 10-bit resolution by the ADC 10 of the first embodiment, the clock latency is 55 (=10×11/2). Therefore, 55 ADCs 10 need to be connected in parallel.

The plurality of ADCs 10 are operated simultaneously after an analog value is held in all of the plurality of sample and hold circuits 22. Since the plurality of ADCs 10 can operate at the same timing, common clock signals $\phi 1$ through $\phi 3$, a common reset signal $\phi R$, and a common control signal CTL can be applied to the plurality of ADCs 10.

Figure 12:
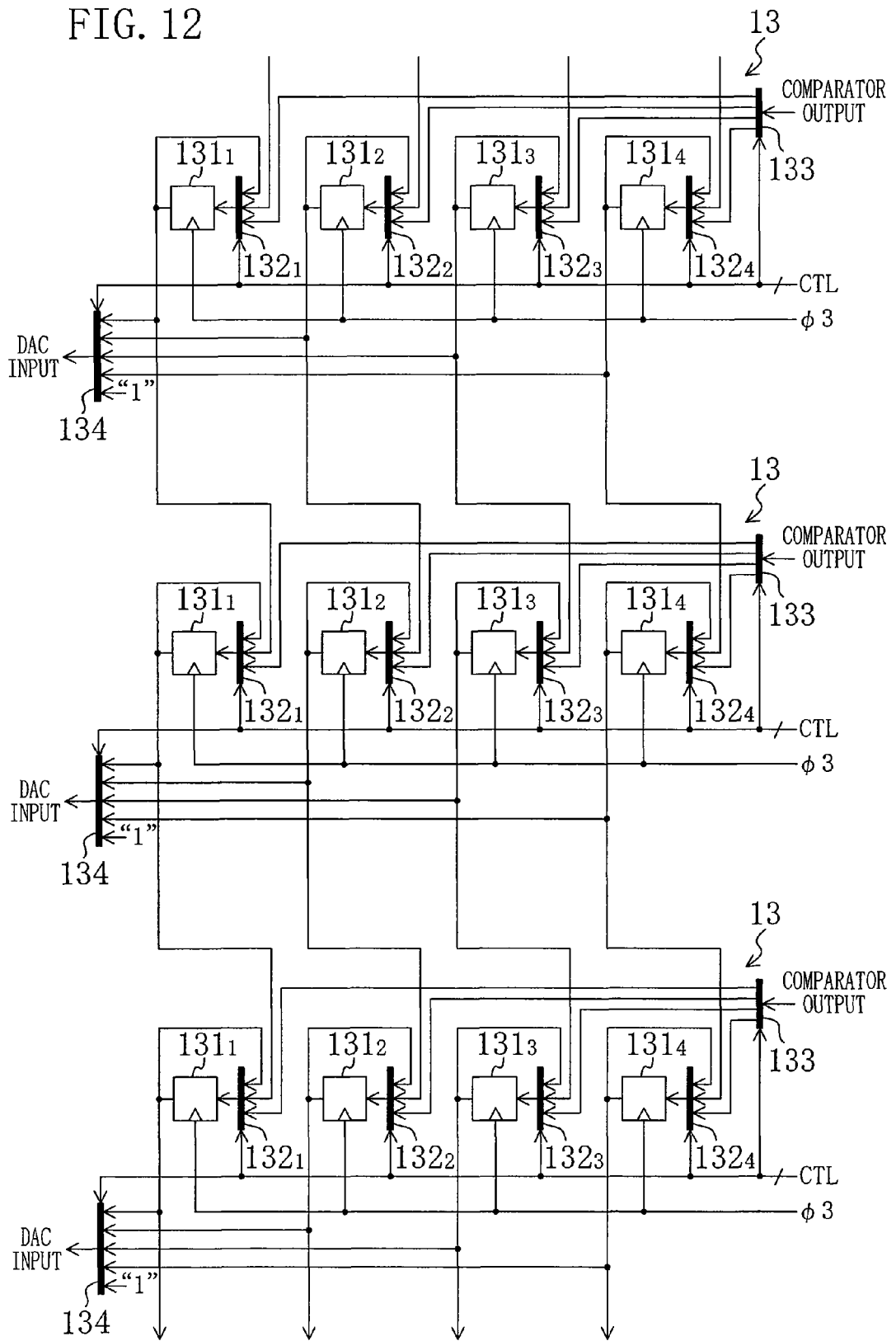
FIG. 12 shows a part of a shift register formed by connecting a plurality of memory means shown in FIG. 4.
Figure 13:
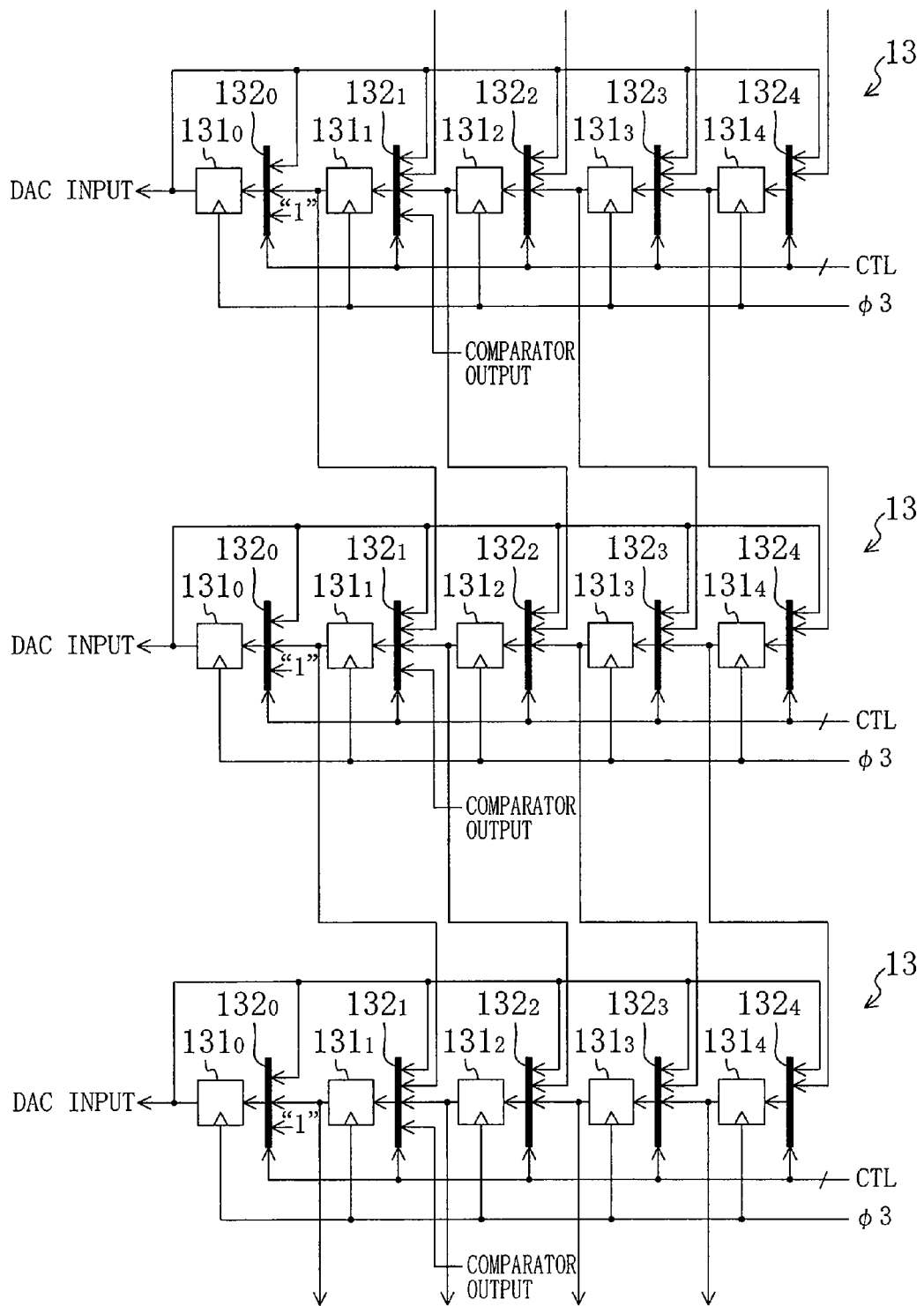
FIG. 13 shows a part of a shift register formed by connecting a plurality of memory means shown in FIG. 5.

In order to retrieve the A-to-D conversion result of each ADC 10, the flip-flops in the respective memory means 13 of the plurality of ADCs 10 are connected to each other to form a shift register. FIGS. 12 and 13 respectively show a part of a shift register formed by connecting a plurality of memory means 13 of FIGS. 4 and 5 to each other. The shift register can be easily formed by connecting an output of each flip-flop in the memory means 13 of each ADC 10 to a selector located on the input side of a corresponding flip-flop in the memory means 13 of an adjacent ADC 10. The A-to-D conversion result of each ADC 10 can be retrieved sequentially from a specific ADC 10 (in FIG. 11, the ADC 10 located at the bottom) by operating this shift register. Note that, since the flip-flop $131_0$ in the memory means 13 of FIG. 5 is not a flip-flop for storing an output value of the comparator 12, this flip-flop $131_0$ does not need to be included in the shift register.

As has been described above, according to this embodiment, A-to-D conversion is performed simultaneously in the plurality of successive approximation type ADCs. Therefore, the overall A-to-D conversion speed can be improved even though each successive approximation type ADC does not have a high conversion speed. Moreover, since successive approximation type ADCs of the first or second embodiment are connected in parallel, the circuit size and power consumption of each successive approximation ADC are very small. Therefore, the overall circuit size and power consumption of the ADC of this embodiment can be significantly suppressed even when several tens of such successive approximation type ADCs are connected in parallel.

In the case where conventional successive approximation type ADCs are connected in parallel, a plurality of circuits for controlling the sub-ADCs are required because each sub-ADC operates at a different timing. In the ADC of this embodiment, however, various common control signals can be used for the plurality of successive approximation type ADCs. Therefore, only one circuit for controlling the sub-ADCs is required. As a result, the overall circuit size and power consumption of the ADC including the control circuit can further be reduced in this embodiment.

Fourth Embodiment

Figure 14:
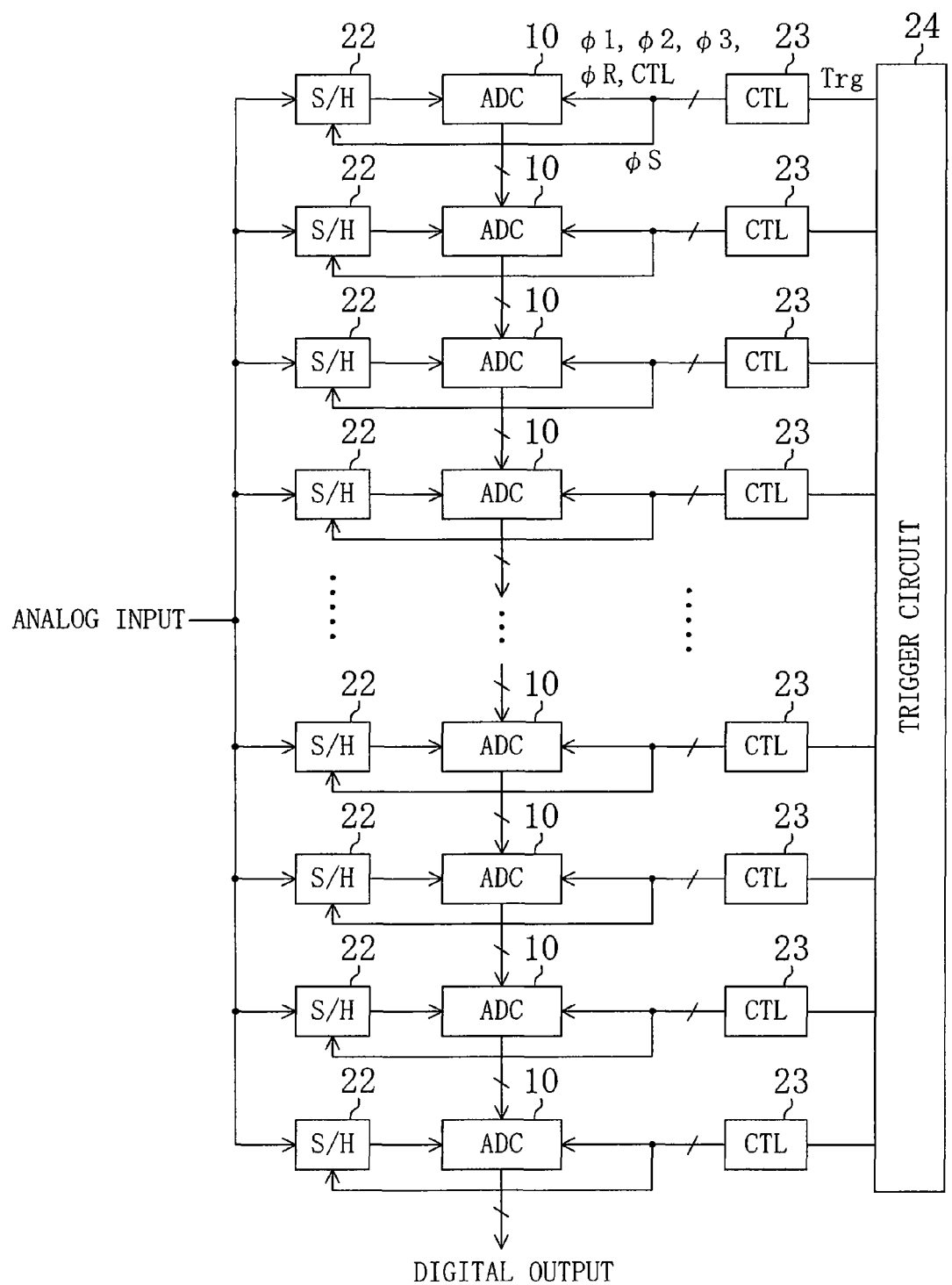
FIG. 14 shows a structure of an ADC according to a fourth embodiment.

In a synchronously controlled ADC as in the third embodiment, skew adjustment of various control signals among sub-ADCs becomes difficult as the number of sub-ADCs is increased. Moreover, since a common clock signal is supplied to all the sub-ADCs, unnecessary clock signal supply lines will also operate, causing a waste of power consumption. Therefore, asynchronous control of sub-ADCs, that is, a method of controlling a multiplicity of sub-ADCs independently of each other, will now be considered. FIG. 14 shows a structure of an ADC according to a fourth embodiment. Only the differences from the third embodiment will be described below.

A common analog signal is applied to a plurality of sample and hold circuits 22. Each of the plurality of sample and hold circuits 22 samples and holds an applied analog signal in response to a pulse signal $\phi S$ from a corresponding control circuit 23. Each of a plurality of control circuits 23 starts controlling a corresponding sample and hold circuit 22 and a corresponding ADC 10 (sub-ADC) in response to a trigger from a trigger circuit 24. More specifically, each control circuit 23 first applies a pulse signal $\phi S$ to a corresponding sample and hold circuit 22 and then starts supplying clock signals $\phi 1$ through $\phi 3$, a reset signal $\phi R$, and a control signal CTL to a corresponding ADC 10. The trigger circuit 24 sequentially applies an operation start trigger Trg to the plurality of control circuits 23. For example, the trigger circuit 24 may be an n-bit shift register that operates in synchronization with a predetermined clock signal, where n is the number of ADCs 10.

Figure 15:
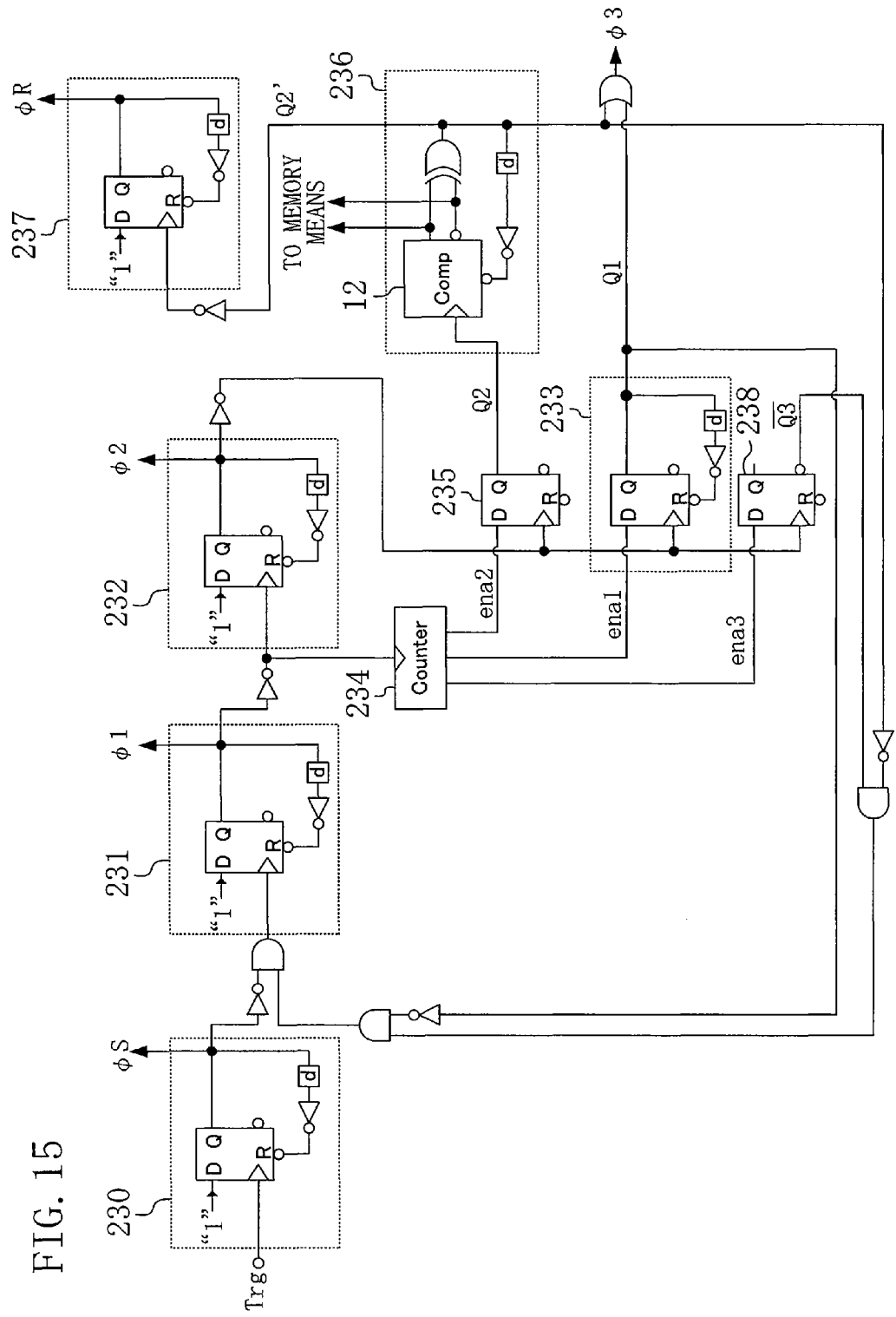
FIG. 15 shows a structure of a main part of a control circuit for controlling the ADC of FIG. 14.
Figure 16:
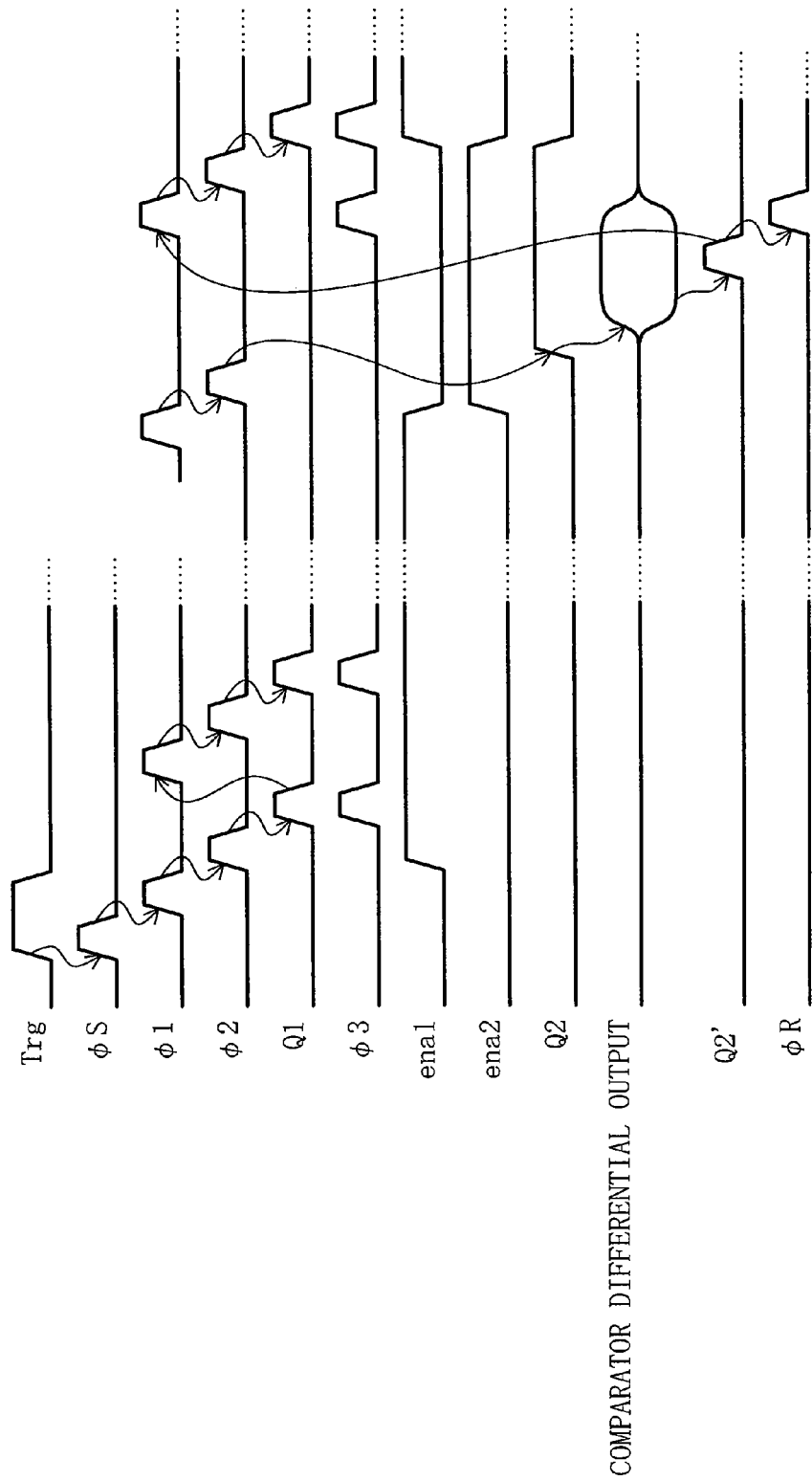
FIG. 16 is a timing chart of various signals that are generated by a control circuit having the structure shown in FIG. 15.

FIG. 15 shows a structural example of a main part of the control circuit 23. Operation of the circuit shown in FIG. 15 will now be described with reference to the timing chart of FIG. 16. A pulse generation circuit 230 outputs a one-shot pulse (a pulse signal $\phi S$) at the rise of a trigger Trg received from the trigger circuit 24. A pulse generation circuit 231 outputs a one-shot pulse (a clock signal φ1) at the fall of the pulse signal φS. A pulse generation circuit 232 outputs a one-shot pulse (a clock signal φ2) at the fall of the clock signal φ1. A pulse generation circuit 233 outputs a one-shot pulse (a pulse signal Q1) at the fall of the clock signal φ2 while a signal ena1 from a counter circuit 234 remains at "1." The pulse signal Q1 is output as a clock signal φ3. The pulse generation circuit 231 outputs a one-shot pulse (a clock signal φ1) at the fall of the pulse signal Q1.

The counter circuit 234 counts pulses output from the pulse generation circuit 231 and switches the respective logic levels of output signals ena1, ena2, and ena3 according to the count value. The signal ena1 is a signal that remains at "1" while a DAC 11 in a corresponding ADC 10 to be controlled by the control circuit 23 is performing D-to-A conversion. The signal ena2 is a signal that rises to "1" when D-to-A conversion of a DAC 11 in a corresponding ADC 10 to be controlled by the control circuit 23 is completed. The signal ena3 is a signal that rises to "1" when A-to-D conversion of a corresponding ADC 10 to be controlled by the control circuit 23 is completed.

A D flip-flop (DFF) 235 latches a signal ena2 in synchronization with a clock signal φ2. In other words, an output signal Q2 of the DFF 235 is a signal that indicates start of comparison operation by the comparator 12 in a corresponding ADC 10 to be controlled by the control circuit 23. In the case where a comparator 12 is a chopper type comparator described above and has differential outputs, completion of the comparison operation of the comparator 12 can be detected by detecting that exclusive OR of the differential outputs becomes "1." The pulse generation circuit 236 including the comparator 12 outputs a one-shot pulse (a pulse signal Q2') when the comparator 12 that operates in response to the rise of an output signal Q2 of the DFF 235 as a trigger completes a comparison operation. The pulse signal Q2' is output as a clock signal φ3. The pulse generation circuit 231 outputs a one-shot pulse (a clock signal φ1) at the fall of the pulse signal Q2'. A pulse generation circuit 237 outputs a one-shot pulse (a clock signal φR) at the fall of the pulse signal Q2'.

A DFF 238 latches a signal ena3 in synchronization with a clock signal φ2. In other words, an inverted output signal /Q3 of the DFF 238 is a signal that indicates stop of operation of a corresponding ADC 10 to be controlled by the control circuit 23. When the signal /Q3 falls to "0," the pulse generation circuit 231 stops generation of a clock signal φ1 and each circuit that has been operating in response to the clock signal φ1 as a trigger is stopped. As a result, the whole operation of a corresponding ADC 10 to be controlled by the control circuit 23 is stopped.

As has been described above, according to this embodiment, a plurality of ADCs 10 are controlled asynchronously. This eliminates the need for skew adjustment of various control signals among the sub-ADCs. Each sub-ADC may complete A-to-D conversion within a predetermined period (for example, a period of a synchronous clock signal of the trigger circuit 24 multiplied by the number of ADCs 10). Therefore, even when the number of sub-ADCs is very large, the circuit layout can be relatively easily implemented. Moreover, each ADC 10 stops its operation at the completion of A-to-D conversion, thereby suppressing a waste of power consumption.

Fifth Embodiment

Figure 17:
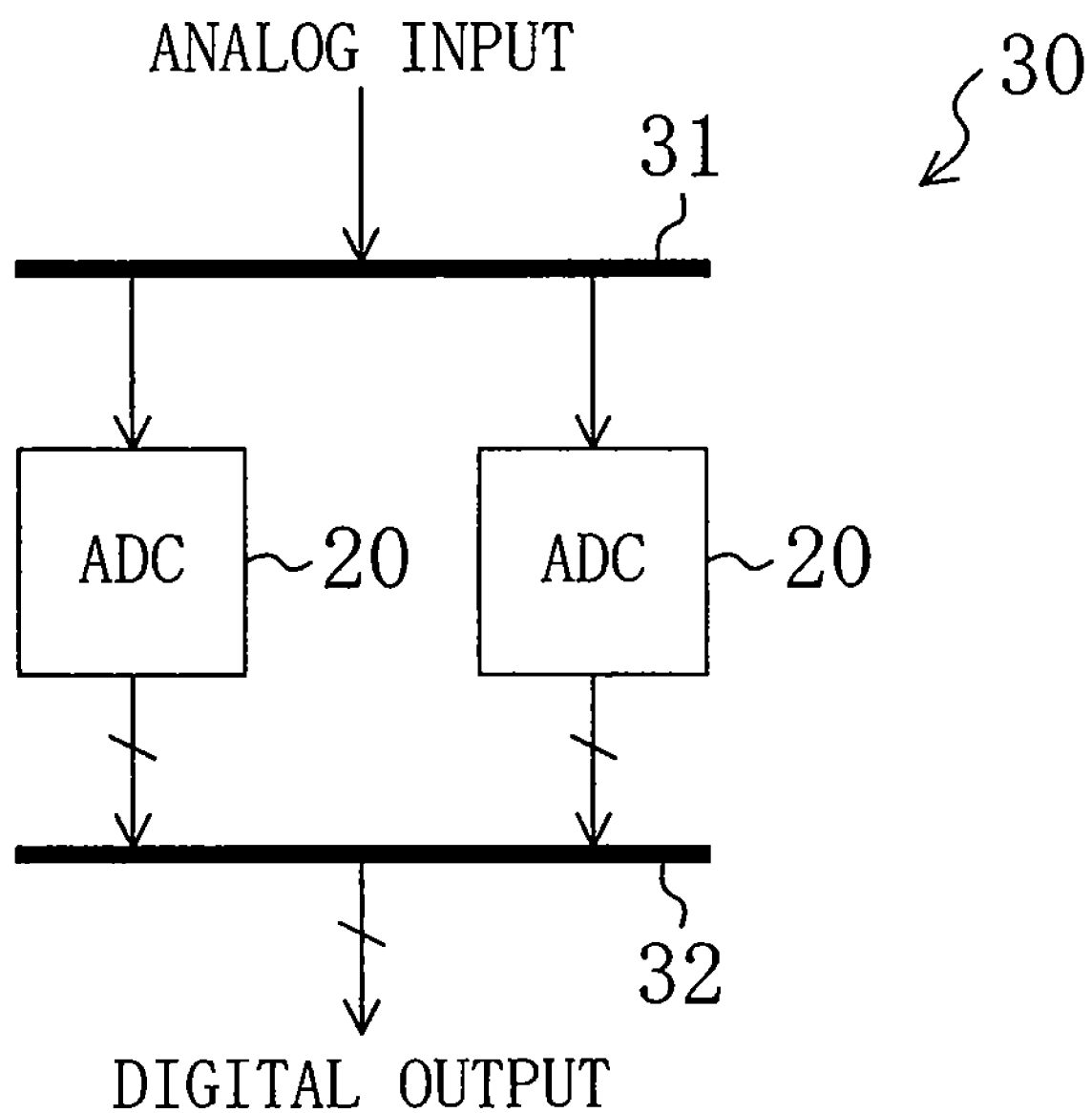
FIG. 17 shows a structure of an ADC according to a fifth embodiment.

FIG. 17 shows a structure of an ADC according to a fifth embodiment. An ADC 30 includes an input selecting section 31, an output selecting section 32, and two ADCs 20. ADCs of the third embodiment are used as the ADCs 20. The input selecting section 31 supplies an input analog signal to one of the two ADCs 20 which is not performing A-D conversion. The output selecting section 32 receives a digital value from one of the two ADCs 20 which is not performing A-D conversion and outputs the received digital value.

Figure 18:
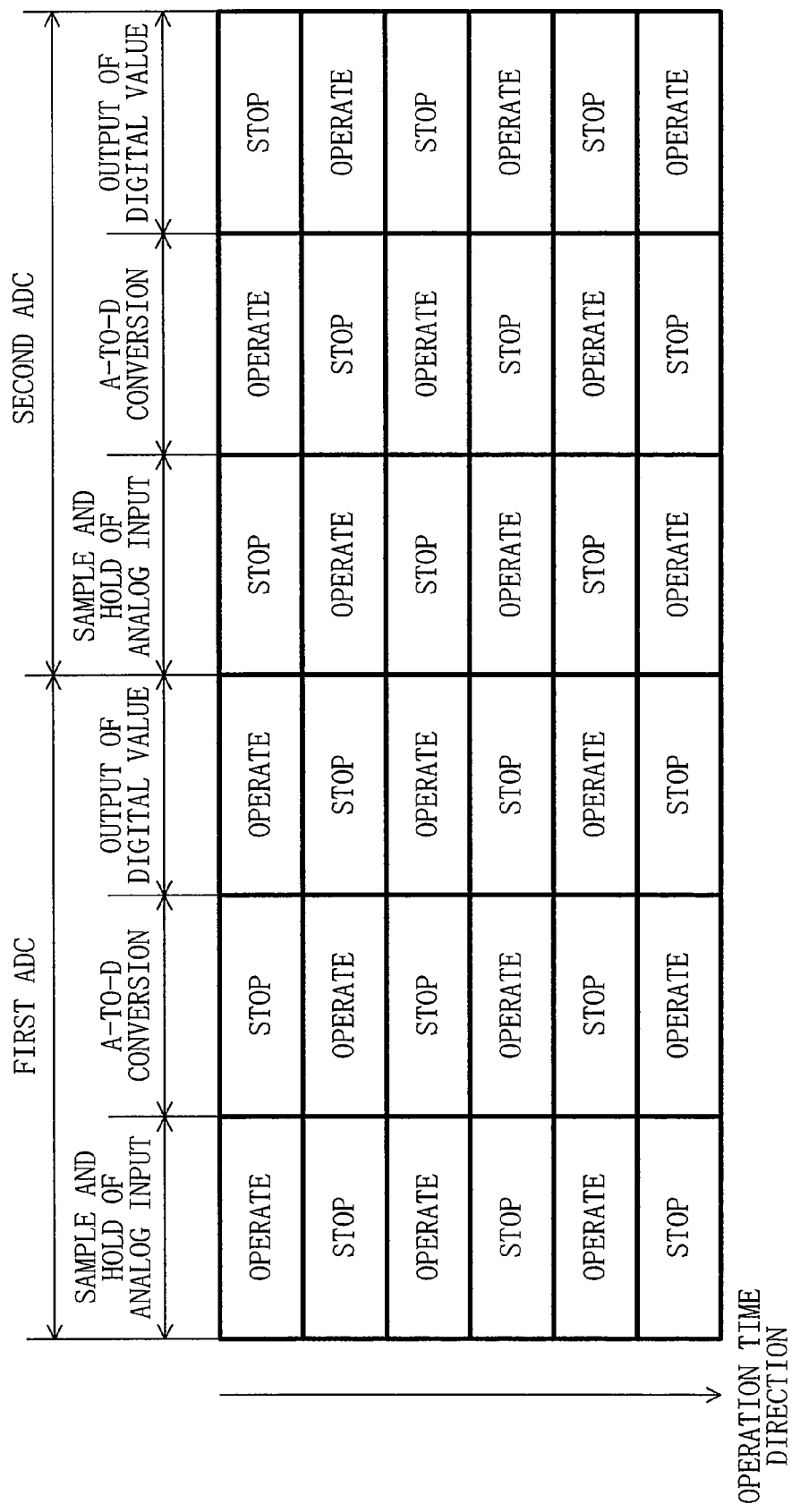
FIG. 18 is an operation timing chart of the ADC of FIG. 17.

It is herein assumed that a series of operations of the ADC 20 is divided into three operations: a sampling operation of supplying an input analog signal to each sample and hold circuit 22; an A-to-D conversion operation of performing A-to-D conversion simultaneously in a plurality of ADCs 10; and an output operation of operating a shift register to sequentially output a digital value. In this case, the sampling operation and the output operation can be performed simultaneously in parallel. However, the A-to-D conversion operation needs to be performed separately. Therefore, as shown in the operation timing chart of FIG. 18, the ADCs 20, the input selecting section 31, and the output selecting section 32 are controlled so that A-to-D conversion operation does not overlap the other operations in each ADC 20 and that while one of the two ADCs 20 is performing A-to-D conversion operation, the other ADC 20 stops A-to-D conversion operation.

Each ADC 20 cannot perform A-to-D conversion while supplying an analog signal to each sample and hold circuit 22. According to this embodiment, however, continuous A-to-D conversion can be implemented by interleave operation of the two ADCs 20. As a result, a continuous signal such as a telecommunication signal can be A-to-D converted at a high speed with low power consumption. It should be understood that interleave operation of three or more ADCs 20 may be implemented.

(Reference Invention Relating to a Cyclic DAC).

A cyclic DAC performs D-to-A conversion by repeating charge redistribution between two capacitors (see, for example, Japanese Laid-Open Patent Publication No. 2006-325184 (pp. 3-4, FIG. 1). Since a cyclic DAC can be basically formed by two capacitors and a few switches, the circuit size and power consumption of a cyclic DAC can be significantly reduced as compared to other types of DACs such as a capacitor array DAC and a resistor string DAC.

However, according to a principle of operation of a cyclic DAC, a digital value to be converted to an analog value is sequentially processed on a bit-by-bit basis from an LSB. Therefore, a cyclic DAC requires n clock cycles of an operation clock signal to process an n-bit digital value. In other words, a cyclic DAC has large clock latency.

In view of the above problem, it is an object of the reference invention to improve an operation speed of a cyclic DAC.

In order to achieve the above object, according to one aspect of the reference invention, a D-to-A converter for converting a digital value to an analog value includes: first and second capacitors having their respective one ends connected to a voltage node corresponding to "0" and having a capacitance ratio of $1:(2^n-1)$, where n is an integer of at least 2; a first switch connected between another end of the first capacitor and another end of the second capacitor; a second switch connected to the another end of the second capacitor and turned on when the first switch is in an off state; and a voltage supply circuit for receiving a digital value to be converted to an analog value on an n-bit-by-n-bit basis sequentially from an LSB, and applying a voltage corresponding to the n-bit digital value to the second capacitor through the second switch. In this structure, when the first switch is in an off state, the voltage supply circuit charges the second capacitor with the voltage corresponding to the n-bit digital value. When the first switch is turned on and the first capacitor and the second capacitor are connected, a digital value that has been stored in the first capacitor is shifted by n bits, and a digital value of upper n bits stored in the second capacitor is added to the first capacitor. In other words, a digital value to be converted to an analog value can be processed on an n-bit by n-bit basis. As a result, D-to-A conversion can be completed in a smaller number of clock cycles.

Preferably, the above D-to-A converter further includes a third switch connected in parallel with the first or second capacitor, and the first and third switches are turned on before the D-to-A converter starts D-to-A conversion.

More specifically, the voltage supply circuit may include a power supply for supplying a plurality of voltages respectively corresponding to each integer from "0" to "$2^n-1$," a selector connected to the second switch for selecting one of the plurality of voltages of the voltage source, and a decoder for generating a signal for controlling the selector from the n-bit digital value.

Preferably, the voltage supply circuit receives an m-bit digital value, where m is an integer larger than n, including an MSB of the digital value to be converted to an analog value, and applies a voltage corresponding to the m-bit digital value to the second capacitor through the second switch. With this structure, a digital value having a larger bit width can be processed toward the end of D-to-A conversion.

More specifically, the voltage supply circuit may include a voltage source for supplying a plurality of voltages respectively corresponding to each integer from "0" to "$2^m-1$," a selector connected to the second switch for selecting one of the plurality of voltages of the voltage source, and a decoder for generating a signal for controlling the selector from the n- or m-bit digital value.

According to another aspect of the reference invention, a D-to-A converter for converting a digital value to an analog value includes: a first capacitor having its one end connected to a voltage node corresponding to "0"; a second capacitor group having its one end connected to the voltage node and having a combined capacitance of ($2^n-1$) times a capacitance of the first capacitor when the second capacitors are connected in parallel, where n is an integer of at least 2; a first switch group connected between another end of the first capacitor and another end of the second capacitor group; a second switch group connected to the another end of the second capacitor group and turned on when the first switch group is in an off state; and a voltage supply circuit for receiving a digital value to be converted to an analog value on an n-bit by n-bit basis sequentially from an LSB, and applying a voltage to the second capacitor group through the second switch group so that total charges of the second capacitor group correspond to the n-bit digital value. In this structure, when the first switch group is in an off state, the voltage supply circuit charges the second capacitor group with the voltage corresponding to the n-bit digital value. When the first switch group is turned on and the first capacitor and the second capacitor group are connected, a digital value that has been stored in the first capacitor is shifted by n bits, and a digital value of upper n bits stored in the second capacitor group is added to the first capacitor. In other words, a digital value to be converted to an analog value can be processed on an n-bit by n-bit basis. As a result, D-to-A conversion can be completed in a smaller number of clock cycles.

Preferably, the D-to-A converter further includes a third switch connected in parallel with the first capacitor or the second capacitor group, and the first and third switches are turned on before the D-to-A converter starts D-to-A conversion.

More specifically, the voltage supply circuit may include a voltage source for supplying a plurality of voltages including a voltage corresponding to "0," a selector group connected to the second switch group for selecting one of the plurality of voltages of the voltage source, and a decoder for generating a signal for controlling the selector group from the n-bit digital value.

Preferably, the voltage supply circuit receives an m-bit digital value, where m is an integer larger than n, including an MSB of the digital value to be converted to an analog value, and applies a voltage to the second capacitor group through the second switch group so that total charges of the second capacitor group correspond to the m-bit digital value. With this structure, a digital value having a larger bit width can be processed toward the end of D-to-A conversion.

More specifically, the voltage supply circuit may include a voltage source for supplying a plurality of voltages including a voltage corresponding to "0," a selector group connected to the second switch group for selecting one of the plurality of voltages of the voltage source, and a decoder for generating a signal for controlling the selector group from the n- or m-bit digital value.

According to still another aspect of the reference invention, a D-to-A converter for converting a digital value to an analog value includes: first and second capacitors having their respective one ends connected to a voltage node corresponding to "0" and having a capacitance ratio of $1:(2^n-1)$, where n is an integer of at least 2; a first switch connected between another end of the first capacitor and another end of the second capacitor; a second switch connected in parallel with the second capacitor and turned on when the first switch is in an off state; and a current supply circuit for receiving a digital value to be converted to an analog value on an n-bit by n-bit basis sequentially from an LSB, and supplying a current pulse corresponding to the n-bit digital value to the second capacitor when the second switch is in an off state. In this structure, the second capacitor is reset when the first switch is in an off state. When the first switch is turned on and the first capacitor and the second capacitor are connected, a digital value that has been stored in the first capacitor is shifted by n bits, and a current pulse corresponding to an n-bit digital value supplied from the current supply circuit is added to the first and second capacitors. In other words, a digital value to be converted to an analog value can be processed on an n-bit by n-bit basis. As a result, D-to-A conversion can be completed in a smaller number of clock cycles.

Preferably, the first and second switches are turned on before the D-to-A converter starts D-to-A conversion.

More specifically, the current supply circuit may include ($2^n-1$) current sources for supplying a current corresponding to "1," ($2^n-1$) switches connected between the another end of the second capacitor and the ($2^n-1$) current sources, respectively, and a control circuit for generating a signal for controlling the ($2^n-1$) switches based on the n-bit digital value and a pulse signal that is activated when the second switch is in an off state.

More specifically, the current supply circuit may include n current sources for supplying a current corresponding to "$2^i$," where i is each integer from 0 to (n−1), n switches connected between the another end of the second capacitor and the n current sources, respectively, and a control circuit for generating a signal for controlling the n switches based on the n-bit digital value and a pulse signal that is activated when the second switch is in an off state.

Preferably, the current supply circuit receives an m-bit digital value, where m is an integer larger than n, including an MSB of the digital value to be converted to an analog value, and supplies a current pulse corresponding to the m-bit digital value to the second capacitor when the second switch is in an off state. With this structure, a digital value having a larger bit width can be processed toward the end of D-to-A conversion.

More specifically, the current supply circuit may include $(2^m-1)$ current sources for supplying a current corresponding to "1," $(2^m-1)$ switches connected between the another end of the second capacitor and the $(2^m-1)$ current sources, respectively, and a control circuit for generating a signal for controlling the $(2^m-1)$ switches based on the n- or m-bit digital value and a pulse signal that is activated when the second switch is in an off state.

More specifically, the current supply circuit may include m current sources for supplying a current corresponding to "$2^i$," where i is each integer from 0 to (m−1), m switches connected between the another end of the second capacitor and the m current sources, respectively, and a control circuit for generating a signal for controlling the m switches based on the n- or m-bit digital value and a pulse signal that is activated when the second switch is in an off state.

As has been described above, according to this reference invention, D-to-A conversion of a cyclic DAC can be completed in a smaller number of clock cycles. As a result, a D-to-A converter with a small circuit size, low power consumption, and small clock latency can be implemented.

Hereinafter, best modes for carrying out the reference invention will be described with reference to the accompanying drawings.

First Reference Embodiment

Figure 19:
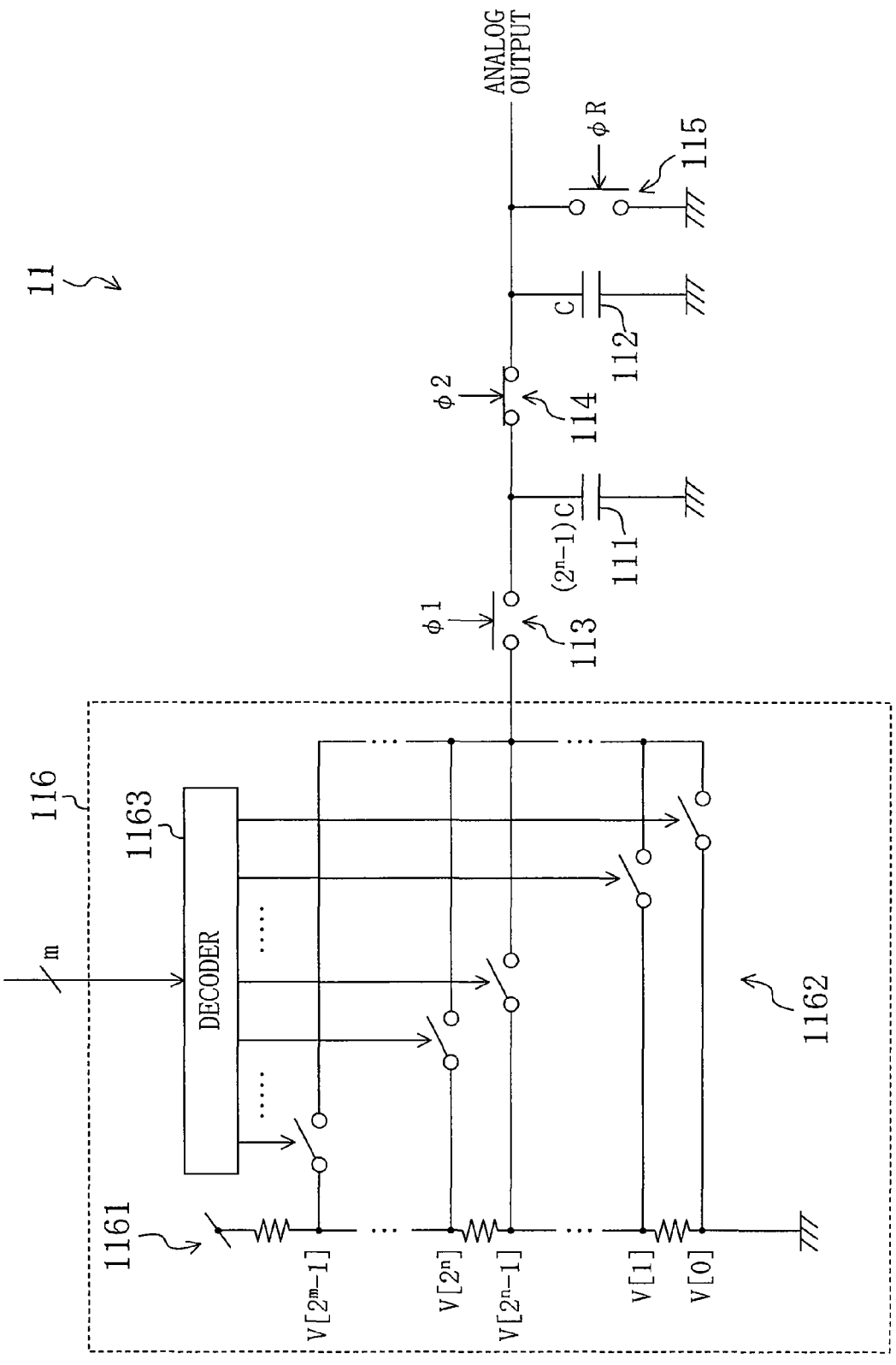
FIG. 19 shows a structure of a cyclic DAC according to a first reference embodiment.

FIG. 19 shows a structure of a cyclic DAC according to a first reference embodiment. In the DAC 11, respective one ends of capacitors 111 and 112 are connected to a ground node. The capacitor 112 has a capacitance value C and the capacitor 111 has a capacitance value of $(2^n-1)$ times C, where n is an integer of at least 2. A switch 113 is connected to the other end of the capacitor 111. A switch 114 is inserted between the other end of the capacitor 111 and the other end of the capacitor 112. The switches 113 and 114 are respectively controlled by clock signals $\phi1$ and $\phi2$ so that one switch is on while the other switch is off. A switch 115 is inserted between the other end of the capacitor 112 and the ground node. A charged voltage of the capacitor 112 is output as an analog output.

When the switch 114 is turned on, the capacitors 111 and 112 are connected in parallel to form a capacitor having a combined capacitance $2^nC$. Charges that have been accumulated in the capacitors 111 and 112 right before the switch 114 is turned on are redistributed to the capacitor formed when the switch 114 is turned on (equalizing operation). In other words, a voltage of the capacitor 111 has a value equal to the total charges that have been accumulated in the capacitors 111 and 112 right before the switch 114 is turned on divided by the capacitance $2^nC$. For example, in the case where the switch 114 is turned on after the capacitor 111 is discharged, a voltage of the capacitor 112 becomes $\frac{1}{2^n}$ times. By repeating this operation m times, a voltage of the capacitor 112 becomes $\frac{1}{2^{nm}}$ times. In other words, a D-to-A conversion value represented as a voltage of the capacitor 112 is shifted by n bits every time the switch 114 is turned on. By charging the capacitor 111 with a voltage corresponding to an n-bit digital value while the switch 114 is off, the n-bit value in the capacitor 111 can be added to the capacitor 112 as upper bits when the switch 114 is turned on. In other words, a digital value to be converted to an analog value can be processed n-bits by n-bits in the DAC 11.

A voltage supply circuit 116 applies a voltage corresponding to an at most m-bit digital value, where m is an integer larger than n, to the capacitor 111 through the switch 113. The voltage supply circuit 116 processes an at most m-bit digital value only when an MSB of a digital value to be converted to an analog value in the DAC 11 is included. Otherwise, the voltage supply circuit 116 processes an n-bit digital value. In other words, the DAC 11 processes a digital value to be converted to an analog value n-bits-by-n-bits sequentially from an LSB, and processes an at most m-bit digital value only when an MSB is included.

In the voltage supply circuit 116, a voltage source 1161 supplies voltages V[0] (a ground voltage) to V[$2^m-1$] respectively corresponding to each integer from "0" to "$2^m-1$." The voltage source 1161 may be, for example, a resistor ladder circuit. A selector 1162 selects one of the plurality of voltages of the voltage source 1161. A voltage selected by the selector 1162 is applied to the capacitor 111 through the switch 113. A decoder 1163 generates a signal for controlling the selector 1162 from an n- or m-bit input digital value. For example, the decoder 1163 generates such a control signal that the selector 1162 selects a voltage V[0] when all the bits of the input digital value is "0," selects a voltage V[1] when only an LSB of the input digital value is "1," and selects a voltage V[$2^n-1$] (in the case where the input digital value is an n-bit digital value) or a voltage V[$2^m-1$] (in the case where the input digital value is an m-bit digital value) when all the bits of the input signal value is "1."

The DAC 11 operates as follows: first, with the switch 113 turned off and the switch 114 turned on, the switch 115 is turned on by a reset signal $\phi R$ and the capacitors 111 and 112 are reset (discharged). Thereafter, the switch 115 is turned off and the switches 113 and 114 are exclusively switched by clock signals $\phi1$ and $\phi2$, respectively. In other words, when the switch 113 is in an on state, a voltage corresponding to an n-bit digital value is applied to the capacitor 111. The switch 114 is then turned on and charges are redistributed between the capacitors 111 and 112. After this equalizing operation is performed a predetermined number of times, a voltage corresponding to an at most m-bit digital value is applied to the capacitor 111 and charges are then redistributed between the capacitors 111 and 112.

As has been described above, according to this embodiment, a D-to-A conversion result can be shifted by n bits by each equalizing operation. Therefore, D-to-A conversion can be performed in a smaller number of clock cycles than in the conventional examples. In other words, the operation speed of the cyclic DAC can be improved. For example, in order to convert a 10-bit digital value to an analog value, a conventional cyclic DAC requires 10 clock cycles, while the DAC 11 of this embodiment requires three clock cycles in the case where n is 3 and m is 4.

The switch 115 may alternatively be inserted between the other end of the capacitor 111 and the ground node. Moreover, the bit width of the input digital value to the voltage supply circuit 116 may be fixed to n. In this case, the voltage source 1161 can supply voltages V[0] to V[$2^n-1$] respectively corresponding to each integer from "0" to "$2^n-1$."

Second Reference Embodiment

Figure 20:
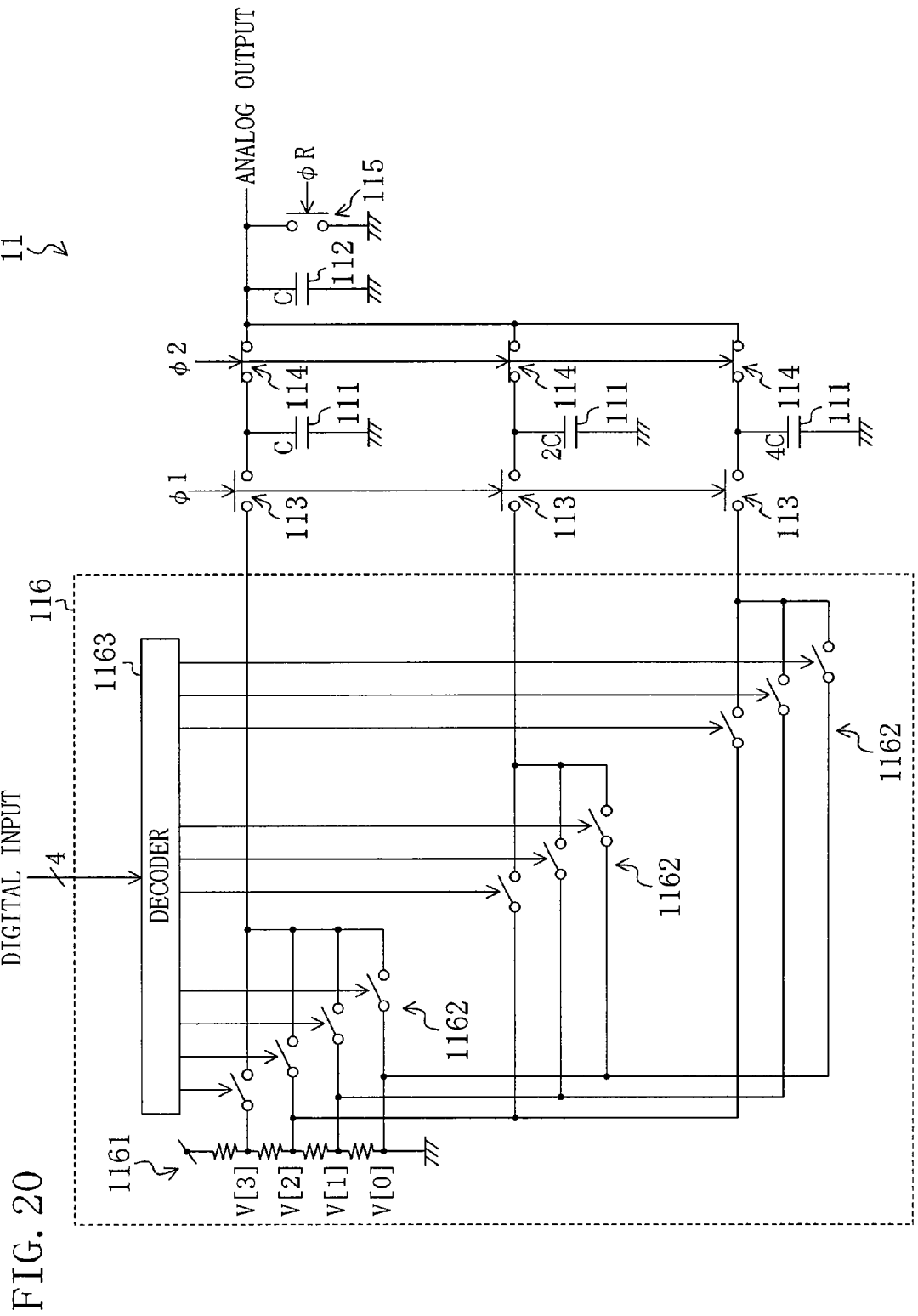
FIG. 20 shows a structure of a cyclic DAC according to a second reference embodiment.

FIG. 20 shows a structure of a cyclic DAC according to a second reference embodiment. In a DAC 11, respective one ends of three capacitors 111 and one end of a capacitor 112 are connected to a ground node. The capacitor 112 has a capacitance value C and the three capacitors 111 have capacitance values C, 2C, and 4C, respectively. Three switches 113 are respectively connected to the respective other ends of the three capacitors 111. Three switches 114 are respectively connected between the other ends of the three capacitors 111 and the other end of the capacitor 112. The switches 113 and 114 are respectively controlled by clock signals φ1 and φ2 so that one switch is on while the other switch is off. A switch 115 is inserted between the other end of the capacitor 112 and the ground node. A charged voltage of the capacitor 112 is output as an analog output.

When the three switches 114 are turned on, the three capacitors 111 and the capacitor 112 are connected in parallel to form a capacitor having a combined capacitance of 8 (=$2^3$) C. Charges that have been accumulated in each of the three capacitors 111 and the capacitor 112 right before the three switches 114 are turned on are redistributed to the capacitor formed when the three switches 114 are turned on (equalizing operation). In other words, a voltage of each capacitor 111 has a value equal to the total charges that have been accumulated in the three capacitors 111 and the capacitor 112 right before the three switches 114 are turned on divided by the capacitance $2^3$C. For example, in the case where the three switches 114 are turned on after the three capacitors 111 are discharged, a voltage of the capacitor 112 becomes $\frac{1}{2^3}$ times. By repeating this operation m times, a voltage of the capacitor 112 becomes $\frac{1}{2^{3m}}$ times. In other words, a D-to-A conversion value represented as a voltage of the capacitor 112 is shifted by 3 bits every time the three switches 114 are turned on. By charging the three capacitors 111 so that the total charges of the three capacitors 111 has a value corresponding to a 3-bit digital value while the three switches 114 are off, the 3-bit value in the three capacitors 111 can be added to the capacitor 112 as upper bits when the three switches 114 are turned on. In other words, a digital value to be converted to an analog value in the DAC 11 can be processed 3-bits by 3-bits.

A voltage supply circuit 116 applies a voltage corresponding to an at most 4-bit digital value to the three capacitors 111 through the three switches 113, respectively. The voltage supply circuit 116 processes an at most 4-bit digital value only when an MSB of a digital value to be converted to an analog value in the DAC 11 is included. Otherwise, the voltage supply circuit 116 processes a 3-bit digital value. In other words, the DAC 11 processes a digital value to be converted to an analog value 3-bits-by-3-bits sequentially from an LSB, and processes an at most 4-bit digital value only when an MSB is included.

In the voltage supply circuit 116, a voltage source 1161 supplies voltages V[0] (a ground voltage) to V[3] respectively corresponding to each integer from "0" to "3." The voltage source 1161 may be, for example, a resistor ladder circuit. Of three selectors 1162, the selector 1162 for selecting a voltage to be applied to the capacitor 111 having a capacitance C selects one of the voltages V[0] to V[3] of the voltage source 1161, and each of the other selectors 1162 selects one of the voltages V[0] to V[2]. Voltages selected by the three selectors 1162 are applied to the three capacitors 111 through the three switches 113, respectively. A decoder 1163 generates a signal for controlling the three selectors 1162 from a 3- or 4-bit input digital value. For example, in the case of a 3-bit input digital value, the decoder 1163 generates such a control signal that the three selectors 1162 select the voltage V[0] or V[1] according to the respective bits of the input digital value. In the case of a 4-bit input digital value, the decoder 1163 generates such a control signal that the selector 1162 for selecting a voltage to be applied to the capacitor 111 having a capacitance C selects one of the voltages V[0] to V[3] according to the lower two bits of the input digital value and that the other two selectors 1162 select the voltage V[0] or V[2] according to the upper two bits of the input digital value, respectively.

The DAC 11 operates as follows: First, with the three switches 113 turned off and the three switches 114 turned on, the switch 115 is turned on by a reset signal φR and the three capacitors 111 and the capacitor 112 are reset (discharged). Thereafter, the switch 115 is turned off and the switches 113 and 114 are exclusively switched by clock signals φ1 and φ2, respectively. In other words, when the three switches 113 are in an on state, charges corresponding to a 3-bit digital value are distributed and accumulated in the three capacitors 111. The three switches 114 are then turned on and the charges are redistributed among the three capacitors 111 and the capacitor 112. Thereafter, charges corresponding to an at most 4-bit digital value are distributed and accumulated in the three capacitors 111, and redistributed among the three capacitors 111 and the capacitor 112.

As has been described above, according to this embodiment, a D-to-A conversion result can be shifted by 3 bits by each equalizing operation as in the first reference embodiment. Therefore, D-to-A conversion can be performed in a smaller number of clock cycles than in the conventional examples. In other words, the operation speed of the cyclic DAC can be improved. For example, in order to convert a 10-bit digital value to an analog value, a conventional cyclic DAC requires 10 clock cycles, while the DAC 11 of this embodiment requires three clock cycles.

The switch 115 may alternatively be inserted between the other end of any one of the three capacitors 111 and the ground node. Moreover, the bit width of the input digital value to the voltage supply circuit 116 may be fixed to 3 that is a bit width by which a D-to-A conversion result can be shifted by each equalizing operation. In this case, the voltage source 1161 can supply two voltages: a voltage corresponding to "0" (a ground voltage); and a voltage corresponding to "1" (e.g., a power supply voltage).

The number of capacitors 111 is not limited to 3. Any number of capacitors 111 may be used as long as a combined capacitance of all the capacitors 111 connected in parallel is ($2^n$−1) times the capacitance of the capacitor 112. Any number of capacitors 111 and any capacitance ratio can be used. In this case, a D-to-A conversion result can be shifted by n bits by each equalizing operation. Especially when n capacitors 111 having a capacitance value $2^i$C., where i is each integer from 0 to (n−1), are used and the maximum bit width of an input digital value to the decoder 1163 is n, the voltage source 1161 can have a simple structure of supplying only voltages respectively corresponding to "0" and "1."

Third Reference Embodiment

Figure 21:
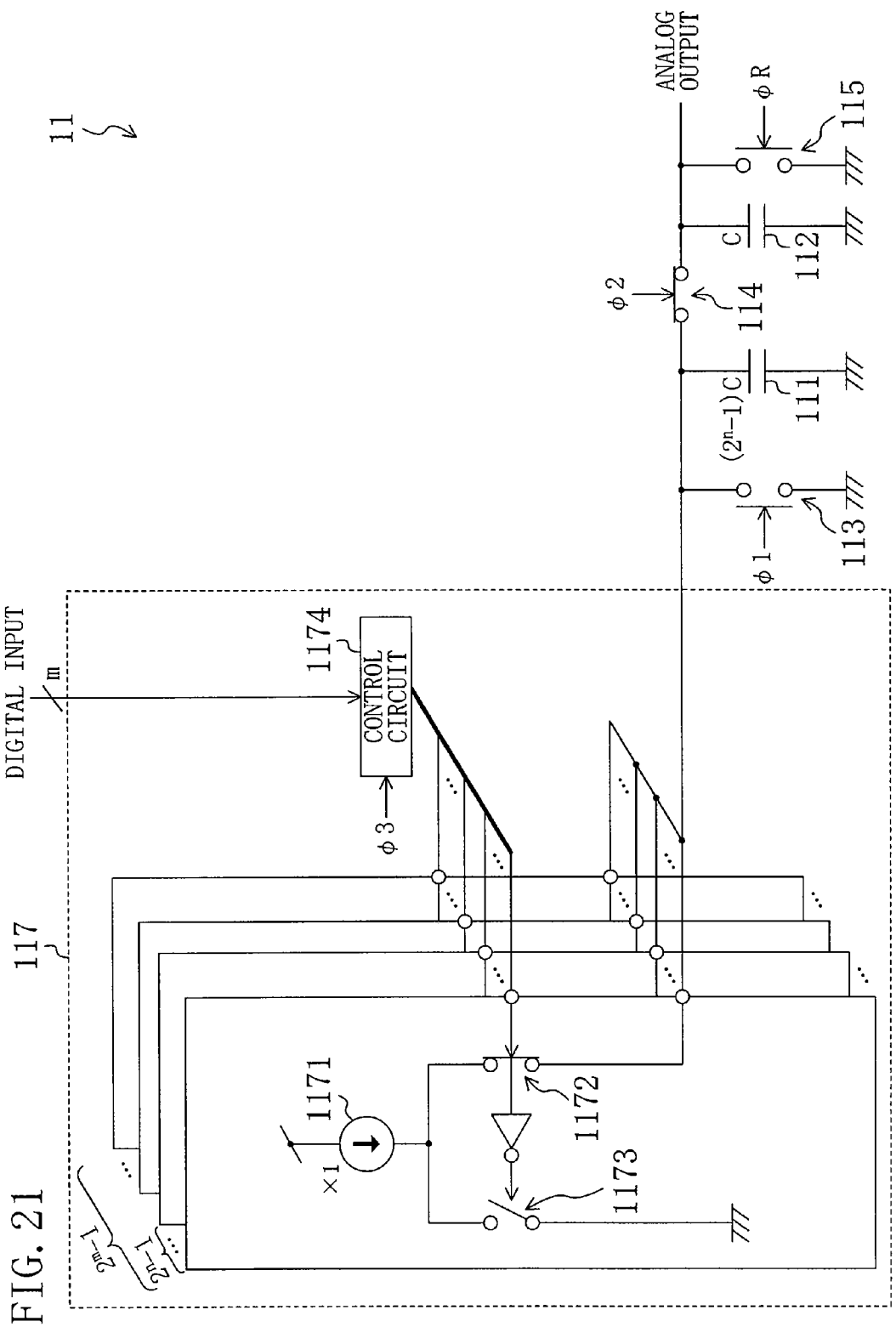
FIG. 21 shows a structure of a cyclic DAC according to a third reference embodiment.

FIG. 21 shows a structure of a cyclic DAC according to a third reference embodiment. In a DAC 11, respective one ends of capacitors 111 and 112 are connected to a ground node. The capacitor 112 has a capacitance value C and the capacitor 111 has a capacitance value of ($2^n$−1) times C, where n is an integer of at least 2. A switch 113 is inserted between the other end of the capacitor 111 and the ground node. A switch 114 is inserted between the other end of the capacitor 111 and the other end of the capacitor 112. The switches 113 and 114 are respectively controlled by clock signals φ1 and φ2 so that one switch is on while the other switch is off. A switch 115 is inserted between the other end of the capacitor 112 and the ground node. A charged voltage of the capacitor 112 is output as an analog output. Note that, as described above, a D-to-A conversion value represented as a voltage of the capacitor 112 is shifted by n bits every time the switch 114 is turned on. Moreover, by setting an n-bit value to the capacitor 111 at a time, a digital value to be converted to an analog value can be processed n-bits by n-bits in the DAC 11.

A current supply circuit 117 supplies a current pulse corresponding to an at most m-bit digital value, where m is an integer larger than n, to the capacitor 111. The current supply circuit 117 processes an at most m-bit digital value only when an MSB of a digital value to be converted to an analog value in the DAC 11 is included. Otherwise, the current supply circuit 117 processes an n-bit digital value. In other words, the DAC 11 processes a digital value to be converted to an analog value n-bits-by-n-bits sequentially from an LSB, and processes an at most m-bit digital value only when an MSB is included.

In the current supply circuit 117, a current source 1171 supplies a current corresponding to "1." A switch 1172 is inserted between the other end of the capacitor 111 and the current source 1171, and a switch 1173 is inserted between the current source 1171 and the ground node. The switches 1172 and 1173 operate so as to have opposite switching states. The current supply circuit 117 has a total of $(2^m-1)$ circuit elements each formed by the current source 1171 and the switches 1172 and 1173. A control circuit 1174 generates a signal for controlling $(2^m-1)$ switches 1172 based on an n- or m-bit input digital value and a pulse signal $\phi3$ that is activated when the switch 113 is off. For example, the control circuit 1174 turns off all the switches 1172 when all the bits of an input digital value are "0," turns on only one of the switches 1172 when only an LSB of the input digital value is "1," and turns on $(2^n-1)$ switches 1172 (in the case where the input digital value is an n-bit digital value) or $(2^m-1)$ switches 1172 (in the case where the input digital value is an m-bit digital value) when all the bits of the input digital value are "1."

The DAC 11 operates as follows: First, with the switch 113 and the $(2^m-1)$ switches 1172 turned off and the switch 114 turned on, the switch 115 is turned on by a reset signal $\phi R$ and the capacitors 111 and 112 are reset (discharged). Thereafter, the switch 115 is turned off and the switches 113 and 114 are exclusively switched by clock signals $\phi1$ and $\phi2$, respectively. The switches 1172 are turned on when the switch 113 is off. In other words, when the switch 113 is off, a current pulse corresponding to an n-bit digital value is supplied to the capacitors 111 and 112. After this equalizing operation is performed a predetermined number of times, a current pulse corresponding to an at most m-bit digital value is supplied to the capacitors 111 and 112.

As has been described above, according to this embodiment, an n-bit digital value is supplied to the capacitors as a current pulse. Therefore, a voltage source having resistive elements as used in the first reference embodiment is not required. Since the cyclic DAC of this embodiment can be structured without resistive elements, the cyclic DAC of this embodiment can operate with a higher speed operation clock signal than that used in the cyclic DAC of the first reference embodiment.

The switch 115 may be omitted. In this case, the capacitors 111 and 112 can be reset by turning on the switches 114 and 113. Moreover, the bit width of the input digital value to the current supply circuit 117 may be fixed to n. In this case, $(2^n-1)$ current sources 1171, $(2^n-1)$ switches 1172, and $(2^n-1)$ switches 1173 are required.

Fourth Reference Embodiment

Figure 22:
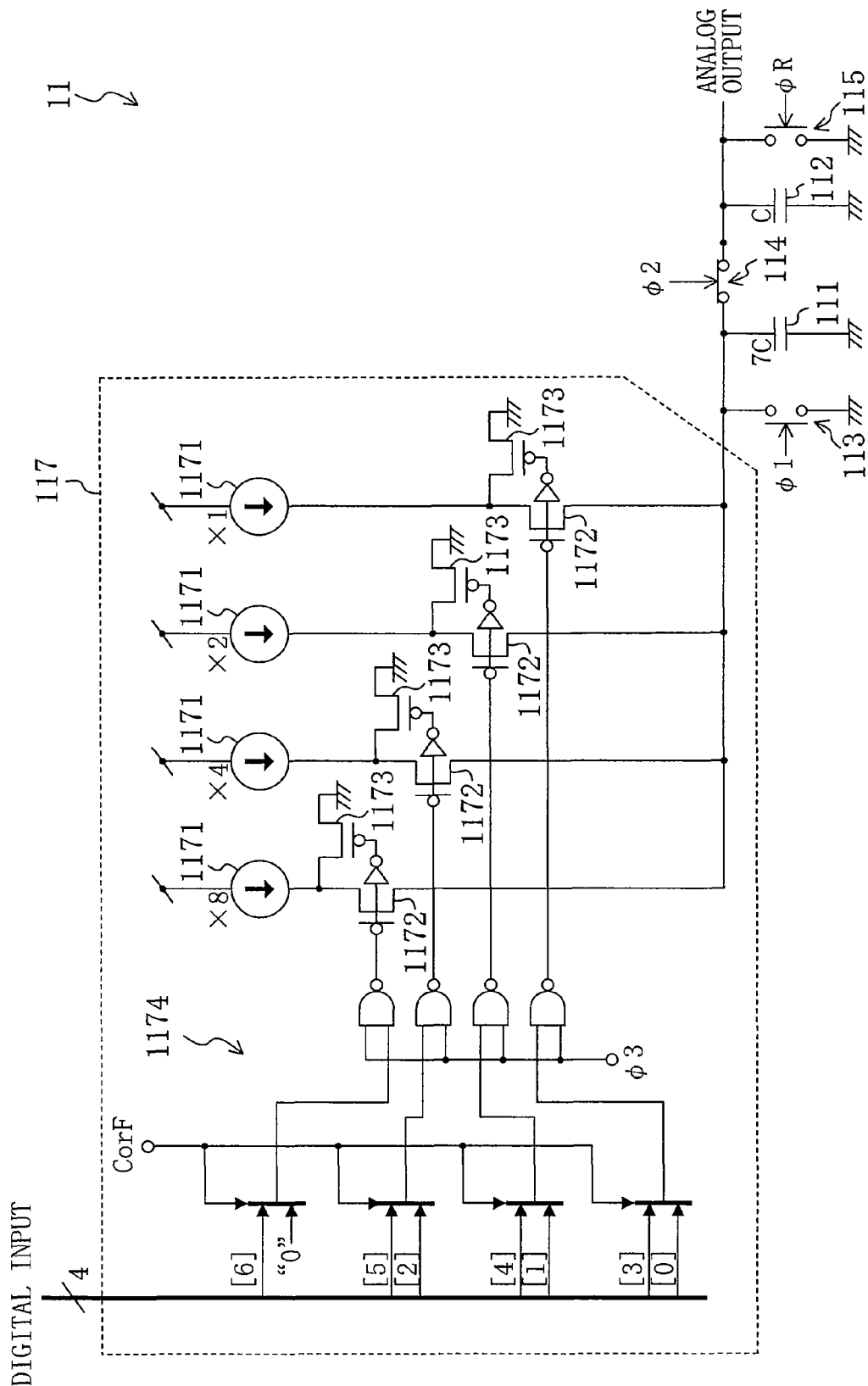
FIG. 22 shows a structure of a cyclic DAC according to a fourth reference embodiment.

FIG. 22 shows a structure of a cyclic DAC according to a fourth reference embodiment. A DAC 11 of this embodiment includes a current supply circuit 117 having a different structure from the third reference embodiment. This embodiment is otherwise the same as the third reference embodiment except that n is 3 and m is 4 in this embodiment. Only the differences from the third reference embodiment will be described below.

The current supply circuit 117 supplies a current pulse corresponding to an at most 4-bit digital value to a capacitor 111. The current supply circuit 117 processes an at most 4-bit digital value only when an MSB of a digital value to be converted to an analog value in the DAC 11 is included. Otherwise, the current supply circuit 117 processes a 3-bit digital value. In other words, the DAC 11 processes a digital value to be converted to an analog value 3-bits by 3-bits, and processes an at most 4-bit digital value only when an MSB is included.

In the current supply circuit 117, four current sources 1171 supply a current corresponding to "$2^i$," where i is each integer from 0 to 3, that is, currents respectively corresponding to "1," "2," "4," and "8." Four switches 1172 are inserted between the other end of the capacitor 111 and the four current sources 1171, respectively. Four switches 1173 respectively corresponding to the four switches 1172 are inserted between the four current sources 1171 and the ground node, respectively. The switches 1172 and 1173 operate so as to have opposite switching state.

A control circuit 1174 outputs a logical AND value of each bit of a 3- or 4-bit input digital value and a pulse signal $\phi3$ as a control signal of the four switches 1172. For example, the control circuit 1174 processes a 7-bit digital value in two stages: lower 3 bits of [0] to [2]; and upper 4 bits of [3] to [6]. Whether the control circuit 1174 processes a 3-bit digital value or a 4-bit digital value is switched by a signal CorF. More specifically, the control circuit 1174 processes a 4-bit digital value when the signal CorF is "0." When the signal CorF is "1," the control circuit 1174 adds "0" to the most significant bit of a 3-bit digital value and processes an input digital value as a 4-bit digital value.

Figure 23:
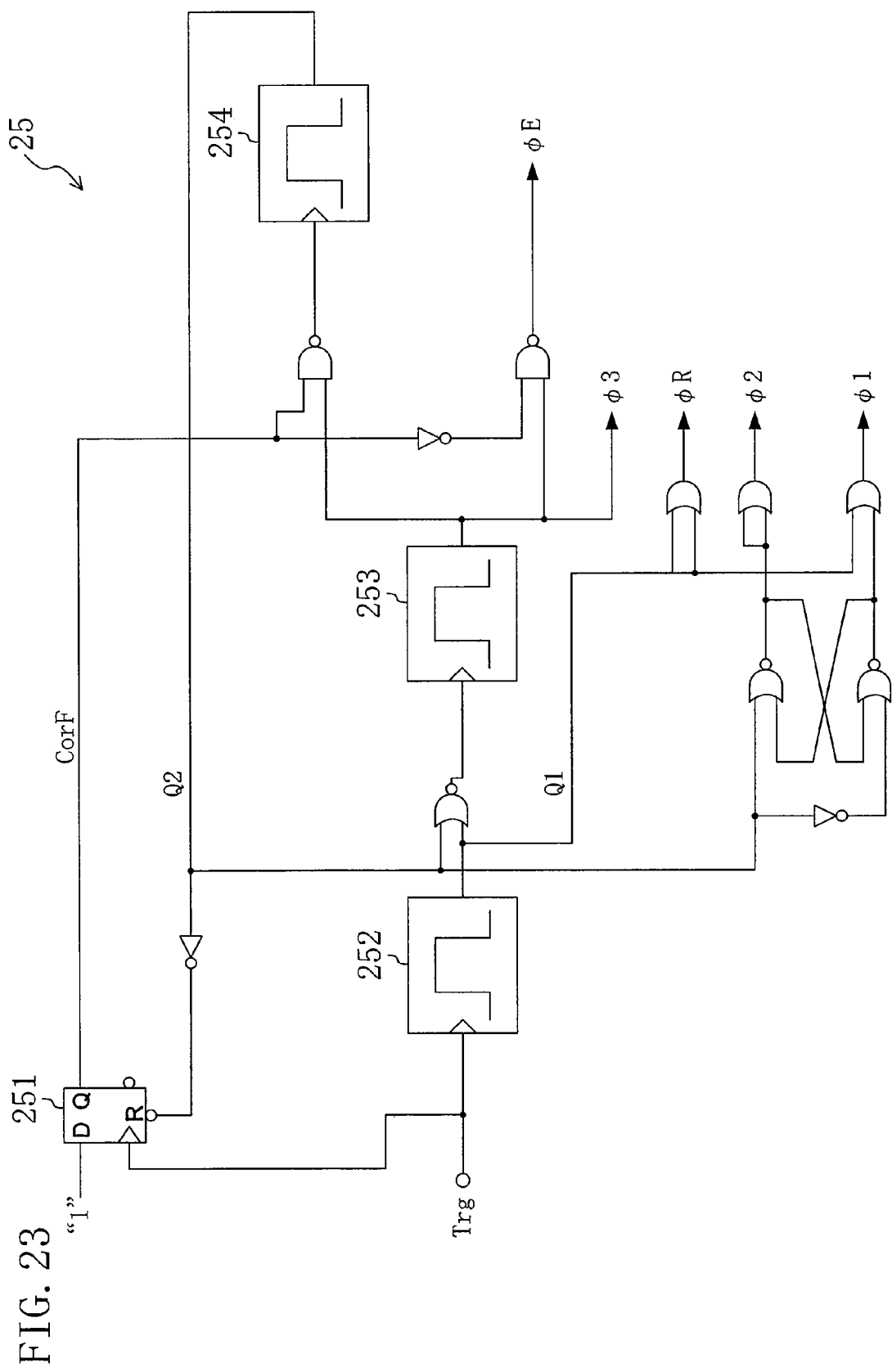
FIG. 23 shows a structure of a control circuit for controlling the cyclic DAC of FIG. 22.
Figure 24:
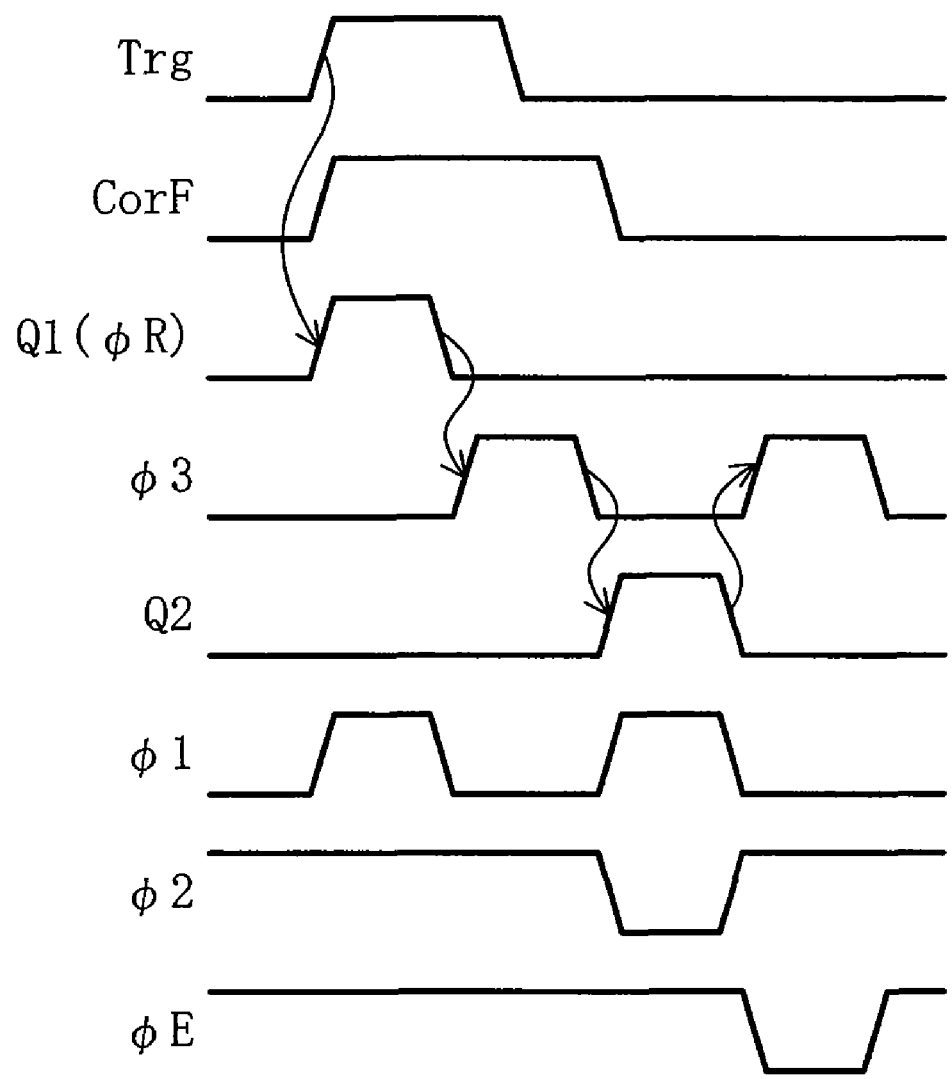
FIG. 24 is a timing chart of various signals that are generated by a control circuit having the structure shown in FIG. 23.

FIG. 23 shows a structural example of a control circuit for controlling the DAC 11 of this embodiment. Operation of a control circuit 25 shown in FIG. 23 will be described with reference to the timing chart of FIG. 24. In response to the rise of a trigger Trg, a signal CorF, which is an output of a D flip-flop (DFF) 251, is set to "1." Accordingly, the control circuit 1174 processes a 3-bit digital value. The pulse generation circuit 252 outputs a one-shot pulse (a pulse signal Q1) at the rise of the trigger Trg. A reset signal $\phi R$ and the pulse signal Q1 are substantially the same, and the reset signal $\phi R$ is generated in response to generation of the pulse signal Q1. A clock signal $\phi1$ rises in response to the rise of the pulse signal Q1. At this time, a clock signal $\phi2$ has been kept at a High level. As a result, the switches 113, 114, and 115 are closed and the capacitors 111 and 112 are reset.

The clock signal $\phi1$ falls in response to the fall of the pulse signal Q1. The pulse generation circuit 253 outputs a one-shot pulse (a pulse signal $\phi3$) at the fall of the pulse signal Q1. The clock signal $\phi2$ has still been kept at a High level. As a result, a current pulse corresponding to a 3-bit input digital value to the current supply circuit 117 is supplied to the capacitors 111 and 112.

A pulse generation circuit 254 outputs a one-shot pulse (a pulse signal Q2) at the fall of the pulse signal $\phi3$. In response to the rise of the pulse signal Q2, the DFF 251 is reset and the signal CorF falls to "0." Accordingly, the control circuit 1174 processes a 4-bit digital value. The clock signal $\phi1$ rises and the clock signal $\phi2$ falls in response to the rise of the pulse signal Q2. As a result, only the capacitor 111 is reset.

The clock signal φ1 falls and the clock signal φ2 rises in response to the fall of the pulse signal Q2. The pulse generation circuit 253 outputs a one-shot pulse (a pulse signal φ3) again in response to the fall of the pulse signal Q2. As a result, a current pulse corresponding to a 4-bit input digital value to the current supply circuit 117 is supplied to the capacitors 111 and 112. When the pulse signal φ3 falls, the signal CorF is "0," and therefore, an end signal φE rises. The rise of the end signal φE indicates that D-to-A conversion by the DAC 11 has been completed.

As has been described above, the cyclic DAC of this embodiment can be structured without resistive elements as in the third reference embodiment. Therefore, the cyclic DAC of this embodiment can operate with a higher speed operation clock signal than that used in the cyclic DAC of the first reference embodiment.

A cyclic D-to-A converter of this reference invention has a small size and is capable of operating at a high speed with low power consumption. Therefore, the cyclic D-to-A converter of this reference invention is useful as a D-to-A converter for use in a liquid crystal driver and the like.

INDUSTRIAL APPLICABILITY

An A-to-D converter of this invention has high performance and low power consumption. Therefore, the A-to-D converter of this invention is useful for use in a front-end part of a communication signal processing or video signal processing system and the like, a software radio system and a multiband receiver for mobile applications, and the like.

The invention claimed is:

1. A successive approximation type A-to-D converter for converting an analog value to a digital value, comprising:
a cyclic D-to-A converter;
a comparator for comparing the analog value with an output value of the D-to-A converter; and
memory means for sequentially storing an output value of the comparator and supplying the stored value to the D-to-A converter in a reverse order
wherein the memory means is structured such that a plurality of flip-flops are connected in a ring shape through selectors for selectively outputting one of one or more inputs, an output value of a first flip-flop is supplied to each selector as one of inputs, an H-level logic value is supplied to a selector located on an input side of the first flip-flop as one of inputs, and an output value of the comparator is supplied to a selector located on an input side of a second flip-flop as one of inputs, and an output value of the first flip-flop is supplied to the D-to-A converter.

2. A successive approximation type A-to-D converter for converting an analog value, comprising:
a cyclic D-to-A converter;
a comparator for comparing the analog value with an output value of the D-to-A converter;
memory means for sequentially storing an output value of the comparator and supplying the stored value to the D-to-A converter in a reverse order;
a capacitor array D-to-A converter;
a successive approximation register for successively storing an output value of the comparator and successively supplying the stored value to the capacitor array D-to-A converter; and
a selector for receiving an output value of the comparator and selectively supplying the received output value to the storage means or the successive approximation register, wherein the comparator compares the analog value with a total output value of the cyclic D-to-A converter and the capacitor array D-to-A converter.

3. An A-to-D converter, comprising:
a plurality of sub A-to-D converters;
a plurality of sample and hold circuits for supplying an analog value to each of the plurality of sub A-to-D converters; and
a multiplexer for sequentially supplying an input analog signal to the plurality of sample and hold circuits, wherein:
each of the plurality of sub A-to-D converters includes:
a cyclic D-to-A converter;
a comparator for comparing the analog value with an output value of the D-to-A converter; and
memory means for sequentially storing an output value of the comparator and supplying the stored value to the D-to-A converter in a reverse order, and
flip-flops included in the respective memory means of the plurality of sub A-to-D converters for storing an output value of the respective comparator are connected together to form a shift register.

4. An A-to-D converter, comprising:
a plurality of A-to-D converters according to claim 3 as a plurality of sub A-to-D converters;
an input selecting section for selecting one of the plurality of sub A-to-D converters which is not performing A-to-D conversion and supplying an input analog signal to the selected sub A-to-D converter; and
an output selecting section for selecting one of the plurality of sub A-to-D converters which is not performing A-to-D conversion and outputting a digital signal that is output from the selected sub A-to-D converter.

5. An A-to-D converter, comprising:
a plurality of sub A-to-D converters;
a plurality of sample and hold circuits for receiving a common analog signal and supplying an analog value to the plurality of sub A-to-D converters, respectively;
a plurality of control circuits for controlling the plurality of sub A-to-D converters and the plurality of sample and hold circuits, respectively;
a trigger circuit for sequentially applying an operation start trigger to the plurality of control circuits, wherein:
each of the plurality of sub A-to-D converters includes:
a cyclic D-to-A converter;
a comparator for comparing the analog value with an output value of the D-to-A converter; and
memory means for sequentially storing an output value of the comparator and supplying the stored value to the D-to-A converter in a reverse order, and
flip-flops included in the respective memory means of the plurality of sub A-to-D converters for storing an output value of the respective comparator are connected together to form a shift register.

6. The A-to-D converter according to claim 5, wherein each of the plurality of control circuits has a plurality of pulse generation circuits for exclusively generating a pulse in response to a pulse generated by another one of the plurality of pulse generation circuits as a trigger, and the cyclic D-to-A converter in each of the plurality of sub A-to-D converters operates according to the pulses respectively output from the plurality of pulse generation circuits.

7. The A-to-D converter according to claim 6, wherein each of the plurality of control circuits includes a counter circuit for counting a predetermined number of pulses that are output from one of the plurality of pulse generation circuits, and each of the plurality of control circuits resets the cyclic D-to-A converter in a corresponding one of the plurality of sub A-to-D converters and stops operation of the control circuit itself according to an output of the counter circuit and a pulse that is output from the remainder of the plurality of pulse generation circuits.

8. An A-to-D converter, comprising:
a plurality of A-to-D converters according to claim 5 as a plurality of sub A-to-D converters;
an input selecting section for selecting one of the plurality of sub A-to-D converters which is not performing A-to-D conversion and supplying an input analog signal to the selected sub A-to-D converter; and
an output selecting section for selecting one of the plurality of sub A-to-D converters which is not performing A-to-D conversion and outputting a digital signal that is output from the selected sub A-to-D converter.

* * * * *